United States Patent
Wu et al.

(10) Patent No.: US 10,658,474 B2
(45) Date of Patent: May 19, 2020

(54) METHOD FOR FORMING THIN SEMICONDUCTOR-ON-INSULATOR (SOI) SUBSTRATES

(71) Applicant: Taiwan Semiconductor Manufacturing Co., Ltd., Hsin-Chu (TW)

(72) Inventors: Cheng-Ta Wu, Shueishang Township (TW); Chia-Shiung Tsai, Hsin-Chu (TW); Jiech-Fun Lu, Madou Township (TW); Kuo-Hwa Tzeng, Taipei (TW); Shih-Pei Chou, Tainan (TW); Yu-Hung Cheng, Tainan (TW); Yeur-Luen Tu, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/103,101

(22) Filed: Aug. 14, 2018

(65) Prior Publication Data
US 2020/0058746 A1    Feb. 20, 2020

(51) Int. Cl.
*H01L 29/40* (2006.01)
*H01L 21/762* (2006.01)
(Continued)

(52) U.S. Cl.
CPC ...... *H01L 29/408* (2013.01); *H01L 21/02238* (2013.01); *H01L 21/31111* (2013.01);
(Continued)

(58) Field of Classification Search
CPC .......... H01L 29/408; H01L 21/02238; H01L 21/31111; H01L 21/3247; H01L 21/76254; H01L 22/26; H01L 29/0649
See application file for complete search history.

(56) References Cited

U.S. PATENT DOCUMENTS

| | | | |
|---|---|---|---|
| 5,013,681 A | 5/1991 | Godbey et al. | |
| 2004/0031979 A1* | 2/2004 | Lochtefeld | H01L 21/76254 257/233 |

(Continued)

OTHER PUBLICATIONS

Filmetrics, Inc. "Advanced Thin-Film Measurement Systems: Taking the Mystery out of Thin-Film Measurement." The date of publication is unknown. Retrieved online on Jun. 6, 2018 from https://wcam.engr.wisc.edu/Public/Tools/Analysis/Filmetrics%20F20%20technical%20reference.pdf.

*Primary Examiner* — Fernando L Toledo
*Assistant Examiner* — Neil R Prasad
(74) *Attorney, Agent, or Firm* — Eschweiler & Potashnik, LLC

(57) ABSTRACT

Various embodiments of the present application are directed to a method for forming a thin semiconductor-on-insulator (SOI) substrate without implantation radiation and/or plasma damage. In some embodiments, a device layer is epitaxially formed on a sacrificial substrate and an insulator layer is formed on the device layer. The insulator layer may, for example, be formed with a net charge that is negative or neutral. The sacrificial substrate is bonded to a handle substrate, such that the device layer and the insulator layer are between the sacrificial and handle substrates. The sacrificial substrate is removed, and the device layer is cyclically thinned until the device layer has a target thickness. Each thinning cycle comprises oxidizing a portion of the device layer and removing oxide resulting from the oxidizing.

20 Claims, 12 Drawing Sheets

(51) Int. Cl.
  *H01L 21/02*    (2006.01)
  *H01L 29/06*    (2006.01)
  *H01L 21/324*   (2006.01)
  *H01L 21/66*    (2006.01)
  *H01L 21/311*   (2006.01)

(52) U.S. Cl.
  CPC .... *H01L 21/3247* (2013.01); *H01L 21/76254* (2013.01); *H01L 22/26* (2013.01); *H01L 29/0649* (2013.01)

(56) References Cited

U.S. PATENT DOCUMENTS

| | | | |
|---|---|---|---|
| 2004/0259328 A1* | 12/2004 | Ito | H01L 22/12 |
| | | | 438/459 |
| 2008/0261055 A1 | 10/2008 | Chu et al. | |
| 2012/0091587 A1* | 4/2012 | Or-Bach | H01L 21/6835 |
| | | | 257/741 |
| 2014/0266383 A1* | 9/2014 | Lu | H03G 7/004 |
| | | | 327/328 |
| 2016/0336233 A1 | 11/2016 | Yonehara et al. | |
| 2016/0351437 A1 | 12/2016 | Peidous et al. | |
| 2017/0133457 A1* | 5/2017 | Zhu | H01L 29/66795 |
| 2018/0294238 A1* | 10/2018 | Hekmatshoartabari | |
| | | | H01L 23/66 |

* cited by examiner

METHOD FOR FORMING THIN SEMICONDUCTOR-ON-INSULATOR (SOI) SUBSTRATES

BACKGROUND

Integrated circuits have traditionally been formed on bulk semiconductor substrates. In recent years, semiconductor-on-insulator (SOI) substrates have emerged as an alternative to bulk semiconductor substrates. An SOI substrate comprises a handle substrate, an insulator layer overlying the handle substrate, and a device layer overlying the insulator layer. Among other things, an SOI substrate leads to reduced parasitic capacitance, reduced leakage current, reduced latch up, and improved semiconductor device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
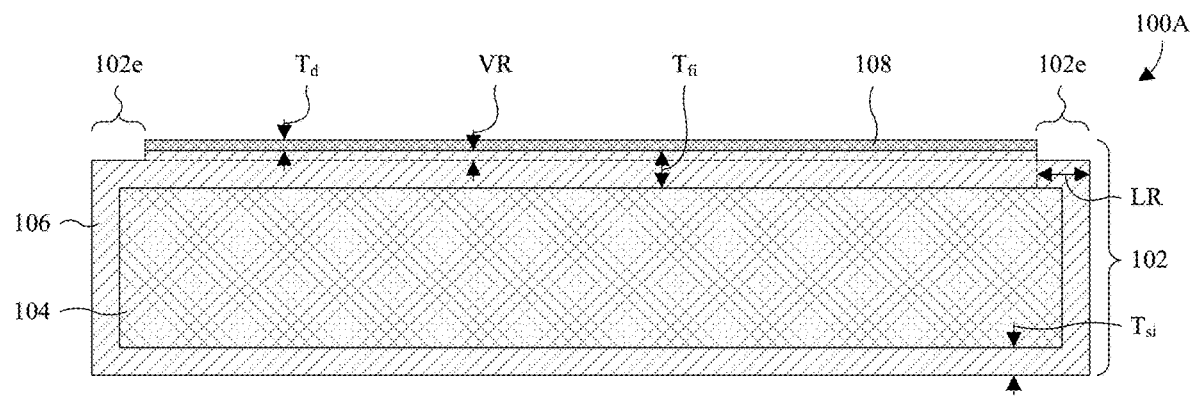
FIGS. 1A and 1B illustrate cross-sectional views of various embodiments of a semiconductor-on-insulator (SOI) substrate without implant radiation and/or plasma damage.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A thin semiconductor-on-insulator (SOI) wafer with a device layer thickness between about 7-14 nanometers, and an insulator layer thickness between about 12-20 nanometers, may find application with fully-depleted metal-oxide-semiconductor (MOS) devices and other advanced MOS devices. Among other things, the thin SOI wafer promotes low leakage and low power consumption for semiconductor devices formed upon the device layer. According to a method for forming the thin SOI wafer, a bond wafer is oxidized to form an oxide layer surrounding the bond wafer. Hydrogen ions are implanted into the bond wafer, through the oxide layer, to form a hydrogen-rich region buried in the bond wafer. The bond wafer is bonded to a handle wafer through the oxide layer, and the bond wafer is split along the hydrogen-rich region to partially remove the oxide layer and the bond wafer from the handle wafer. A chemical mechanical polish (CMP) is then performed into a bond wafer portion remaining on the handle wafer to flatten the bond wafer portion. The handle wafer, the bond wafer portion, and an oxide layer portion remaining on the handle wafer collectively define the thin SOI wafer.

A challenge with the method is that the hydrogen implantation may cause implant radiation and/or plasma damage to the oxide layer portion and the bond wafer portion remaining on the handle wafer. Such damage may, in turn, cause high leakage and power consumption for semiconductor devices formed on the SOI wafer. A potential solution to the damage is a high temperature anneal. However, it's difficult to fully repair the damage with the high temperature anneal and, in any event, the high temperature anneal leads to increased costs and increased process complexity. Another challenge with the method is that the hydrogen implantation may cause positive charge to become trapped in the oxide layer portion remaining on the handle wafer, which may negatively impact the performance of semiconductor devices formed on the SOI wafer. For example, the positive charge may shift threshold voltages, ON resistances, and other parameters of semiconductor devices formed on the SOI wafer. Yet another challenge with the method is high cost due to the implantation, the splitting, and the CMP.

Various embodiments of the present application are directed towards a method for forming a thin SOI substrate without implant radiation and/or plasma damage, as well as the thin SOI substrate resulting from the method. In some embodiments, a first insulator layer is deposited on a handle substrate. A buffer layer is epitaxially formed on a sacrificial substrate, an etch stop layer is epitaxially formed on the buffer layer, a device layer is epitaxially formed on the etch stop layer, and a second insulator layer is deposited on the device layer. The etch stop layer may, for example, be or comprise undoped silicon germanium, boron doped silicon germanium, boron doped elemental silicon, or any combination of the foregoing. The second insulator layer may, for example, have a net charge that is negative or neutral. The sacrificial substrate is bonded to the handle substrate, such that the buffer layer, the etch stop layer, the device layer, the first insulator layer, and the second insulator layer are between the sacrificial and handle substrates. The sacrificial substrate is removed, which is followed by removal of the buffer layer, which is followed by removal of the etch stop layer. Removal of the buffer layer may, for example, comprise a tetramethylammonium hydroxide (TMAH) wet etch. Removal of the etch stop layer may, for example, comprise a hydrochloric acid (HCl) wet etch, followed by in-situ annealing to smooth an exposed surface of the device layer. After the removal of the etch stop layer, the device layer is cyclically thinned until the device layer has a target thickness. Each thinning cycle comprises oxidizing a portion of the device layer and removing oxide resulting from the oxidizing.

By cyclically thinning the device layer to the target thickness, multiple small thinning processes may be performed instead of one large thinning process. This, in turn, allows greater control over the final thickness of the device layer. For example, the thickness of the device layer may be accurately reduced to a final thickness less than about 20, 14, or 10 nanometers and/or between about 7-20 nanometers or about 7-14 nanometers. Such small thicknesses find application with fully-depleted MOS devices and other advanced MOS devices.

By forming the second insulator layer with a net charge that is neutral, the second insulator layer does not impact performance (e.g., ON resistance, threshold voltage, etc.) of semiconductor devices formed on the SOI substrate. By forming the second insulator layer with a net charge that is negative, the second insulator layer electrostatically repels negative charge, thereby preventing or reducing leakage for the semiconductor devices. The reduced leakage leads to higher power efficiency and performance for the semiconductor devices.

By depositing the first and second insulator layers, and by epitaxially forming the device layer, the first and second insulator layers and the device layer are not subject to implant radiation and/or plasma damage during formation of the SOI substrate. For example, there may be no hydrogen implant process to form the device layer and the first and second insulator layers. Since there is no implant radiation and/or plasma damage, leakage is prevented or reduced for semiconductor devices formed on the SOI substrate. The reduced leakage leads to higher power efficiency and performance for the semiconductor devices.

By forming the etch stop layer such that it is or comprise undoped silicon germanium, boron doped silicon germanium, boron doped elemental silicon, or any combination of the foregoing, a TMAH wet etch to remove the buffer layer may, for example, be performed with high selectivity for the buffer relative to the etch stop layer. As a result, the buffer layer may be removed with minimal damage (e.g., due to over etching) to the etch stop layer. Further, the etch stop layer may have a small total thickness variation (TTV), such that subsequent processing may be highly uniform. For example, subsequent etching to remove the etch stop layer may be highly uniform. The more uniform subsequent processing, the more uniform the final thickness of the device layer and the higher the quality of the device layer.

By using the HCl thermal etch to remove the etch stop layer, selectivity may be high for the etch stop layer relative to device layer. As a result, damage to device layer (e.g., due to over etching) is minimal and the TTV of the device layer is small. Further, performing the in-situ annealing to smooth the device layer further reduces the surface roughness of the device layer. The small TTV and reduced surface roughness of the device layer, in turn, promotes high uniformity between semiconductor devices formed on the device layer and is increasingly important as semiconductor devices continue to shrink in size.

With reference to FIG. 1A, a cross-sectional view 100A of some embodiments of a SOI substrate 102 is provided. In some embodiments, the SOI substrate 102 has a circular top layout and/or has a diameter of about 200, 300, or 450 millimeters. In other embodiments, the SOI substrate 102 has some other shape and/or some other dimensions. Further, in some embodiments, the SOI substrate 102 is a semiconductor wafer. The SOI substrate 102 comprises a handle substrate 104, an insulator layer 106, and a device layer 108. The handle substrate 104 may be or comprise, for example, monocrystalline silicon, some other silicon material, some other semiconductor material, or any combination of the foregoing.

In some embodiments, the handle substrate 104 has a high resistance and/or a low oxygen concentration. The high resistance may, for example, be greater than about 1, 3, 4, or 9 kilo-ohms/centimeter (1M/cm), and/or may, for example, be about 1-4 kΩ/cm, about 4-9 kΩ/cm, or about 1-9 kΩ/cm. The low oxygen concentration may, for example, be less than about 1, 2, or 5 parts per million atoms (ppma), and/or may, for example, be between about 0.1-2.5 ppma, about 2.5-5.0 ppma, or about 0.1-5.0 ppma. The low oxygen concentration and the high resistance individually reduce substrate and/or radio frequency (RF) losses. In some embodiments, the handle substrate 104 has a low resistance. The low resistance reduces costs of the handle substrate 104 but may lead to increased substrate and/or RF losses. The low resistance may, for example, be less than about 8, 10, or 12 Ω/cm, and/or may, for example, be between about 8-12 Ω/cm, about 8-10 Ω/cm, or about 10-12 Ω/cm. In some embodiments, the handle substrate 104 is doped with p-type or n-type dopants. The resistance of the handle substrate 104 may, for example, be controlled by a doping concentration of the handle substrate 104. For example, increasing the doping concentration may decrease resistance, whereas decreasing the doping concentration may increase resistance, or vice versa.

The insulator layer 106 overlies the handle substrate 104 and may be or comprise, for example, silicon oxide, silicon-rich oxide (SRO), some other dielectric, or any combination of the foregoing. As seen hereafter, due to the method by which the SOI substrate 102 is formed, the insulator layer 106 is free from implant radiation and/or plasma damage. As a result, leakage is low, and performance (e.g., power efficiency, switching speed, etc.) is high, for semiconductor devices formed on the SOI substrate 102. Further, due to the method by which the SOI substrate 102 is formed, the insulator layer 106 has a net charge that negative or neutral at an interface with the device layer 108. By having a neutral charge at the device layer interface, the insulator layer 106 does not impact performance (e.g., ON resistance, threshold voltage, etc.) of semiconductor devices formed on the SOI substrate 102. By having a negative charge at the device layer interface, the insulator layer 106 electrostatically repels negative charge, thereby preventing or reducing leakage for semiconductor devices formed on the SOI substrate 102.

In some embodiments, the insulator layer 106 has a first insulator thickness $T_{fi}$ at the device layer 108, and further has a second insulator thickness $T_{si}$ at SOI edge portions 102e of the SOI substrate 102, sidewalls of the SOI substrate 102, a bottom surface of the SOI substrate 102, or any combination of the foregoing. The first insulator thickness $T_{fi}$ is greater than the second insulator thickness $T_{si}$ and may, for example, be between about 120-200 angstroms, about 120-160 angstroms, or about 160-200 angstroms. The second insulator thickness $T_{si}$ may, for example, be between about 100-150 angstroms, about 100-125 angstroms, or about 125-150 angstroms. In some embodiments, the insulator layer 106 completely encloses the handle substrate 104 and/or has a stepped profile at the SOI edge portions 102e. In some embodiments, the insulator layer 106 has upper surfaces that are at the SOI edge portions 102e and that are recessed below a top surface of the insulator layer 106 by a vertical recess amount VR. The vertical recess amount VR may, for example, be about 20-50 angstroms, about 20-35 angstroms, or about 35-50 angstroms. In some embodiments, the sum of the vertical recess amount VR and the second insulator thickness $T_{si}$ is equal or about equal to the first insulator thickness $T_{fi}$. In some embodiments, the insulator layer 106 has inner sidewalls that are at the SOI edge portion 102e and that are laterally recessed respectively from outer sidewalls of the insulator layer 106 by a lateral recess amount LR. The lateral recess amount LR may, for example, be about 0.8-1.2 millimeters, about 0.8-1.0 millimeters, or about 1.0-1.2 millimeters.

The device layer 108 overlies the insulator layer 106 and may, for example, be or comprise monocrystalline silicon, some other silicon, some other semiconductor material, or any combination of the foregoing. As seen hereafter, due to the method by which the SOI substrate 102 is formed, the device layer 108 is free from implant radiation and/or plasma damage. As a result, leakage is low, and performance (e.g., power efficiency, switching speed, etc.) is high, for semiconductor devices formed on the SOI substrate 102.

In some embodiments, a thickness $T_d$ of the device layer 108 is small (i.e., the device layer 108 is thin). The thickness $T_d$ of the device layer 108 may, for example, be small in that it is less than about 10, 14, or 20 nanometers, and/or is between about 7-14 nanometers or about 14-20 nanometers. Further, the thickness $T_d$ may, for example, be small in that it is equal or about equal to a depletion region width of a semiconductor device formed on the SOI substrate 102. The semiconductor device may be, for example, a MOS field-effect transistor (MOSFET) or some other semiconductor device, and/or the depletion region width may, for example, be the depth to which a depletion region of the semiconductor device extends in the device layer 108. In some embodiments in which the thickness $T_d$ of the device layer 108 is small, electrical isolation between semiconductor devices formed on the device layer 108 may be enhanced. For example, due to the thickness $T_d$ of the device layer 108 being small, shallow trench isolation (STI) structures and/or other isolation structures may extend fully through the device layer 108 to the insulator layer 106 to provide complete or near complete electrical isolation between neighboring semiconductor devices. Further, in embodiments in which the thickness $T_d$ of the device layer 108 is small, fully-depleted semiconductor devices may be formed on the device layer. Fully-depleted semiconductor devices generally have higher switching speeds and higher power efficiency than their partially-depleted counterparts.

In some embodiments, a TTV of the device layer 108 is low. The TTV is the difference between the minimum thickness value for the device layer 108 and the maximum thickness value for the device layer 108. The TTV of the device layer 108 may, for example, be low in that it is less than about 20, 10, or 5 nanometers, and/or is between about 5-20 nanometers, about 5-12 nanometers, about 12-20 nanometers, or about 8-12 nanometers. The low TTV promotes uniformity in parameters of semiconductor devices formed on the device layer 108. Such parameters may, for example, include threshold voltage, on-current, and so on. As semiconductor devices continue to shrink, the low TTV becomes increasingly important.

Figure 1B:
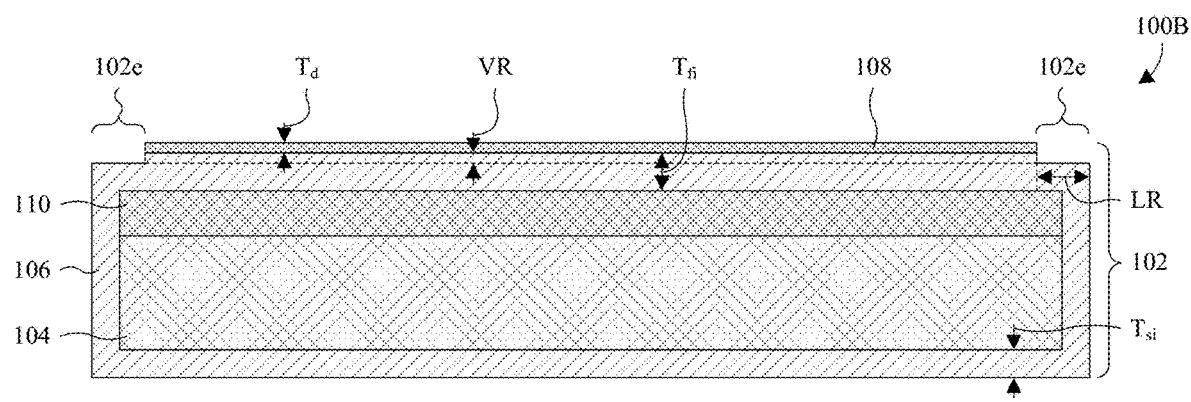

With reference to FIG. 1B, a cross-sectional view 100B of some alternative embodiments of the SOI substrate 102 of FIG. 1A is provided in which a trap-rich layer 110 separates the handle substrate 104 from the insulator layer 106. The trap-rich layer 110 has a high density of carrier traps relative to the handle substrate 104 and/or relative to the device layer 108. The carrier traps may be or comprise, for example, dislocations and/or other defects in a crystalline lattice of the trap-rich layer 110. The carrier traps trap mobile carriers (e.g., mobile electrons) along a top surface of the handle substrate 104 to reduce the effects of parasitic surface conduction (PSC). The mobile carriers may, for example, be drawn to the top surface of the handle substrate 104 by fixed charge in the insulator layer 106. By reducing the effects of PSC, the trap-rich layer 110 promotes low substrate and/or RF losses, passive devices with high Q factors, low crosstalk, and high linearity (e.g., low second harmonics).

In some embodiments, the trap-rich layer 110 is or comprises undoped polycrystalline silicon, amorphous silicon, or some other suitable semiconductor material that has a high density of carrier traps. In some embodiments in which the trap-rich layer 110 is or comprises undoped polycrystalline silicon, the carrier traps concentrate at grain boundaries of the undoped polycrystalline silicon and reducing grain sizes of the undoped polycrystalline silicon increases the density of carrier traps in the undoped polycrystalline silicon.

Figure 2:
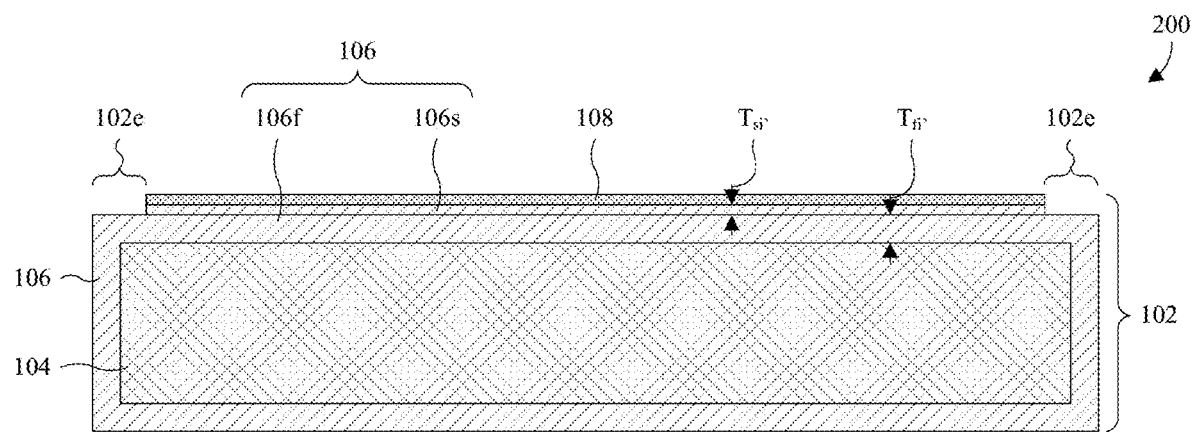
FIG. 2 illustrates a cross-sectional view of some more detailed embodiments of the SOI substrate comprising insulator layers with different charges.

With reference to FIG. 2, a cross-sectional view 200 of some more detailed embodiments of the SOI substrate 102 of FIG. 1A is provided in which the insulator layer 106 comprises a first insulator layer 106f, and further comprises a second insulator layer 106s overlying the first insulator layer 106f. The first insulator layer 106f and the second insulator layer 106s may be or comprise, for example, silicon oxide, SRO, some other dielectric, or any combination of the foregoing.

In some embodiments, the first and second insulator layers 106f, 106s have different charges. For example, the first insulator layer 106f may have a positive or neutral charge, whereas the second insulator layer 106s may have a negative charge. As another example, the first insulator layer 106f may have a positive charge, whereas the second insulator layer 106s may have a neutral charge. In other embodiments, the first and second insulator layers 106f, 106s have the same charges. For example, the first and second insulator layers 106f, 106s may have negative or neutral charges. In some embodiments, the first and second insulator layers 106f, 106s are different materials. In other embodiments, the first and second insulator layers 106f, 106s are the same material. In some embodiments, a first thickness $T_{fi'}$ of the first insulator layer 106f is between about 120-200 angstroms, about 120-160 angstroms, or about 160-200 angstroms, and/or a second thickness $T_{si'}$ of the second insulator layer 106s is between about 100-150 angstroms, about 100-125 angstroms, or about 125-150 angstroms. In some embodiments, the first thickness $T_{fi'}$ is greater than the second thickness $T_{si'}$.

While FIG. 2 illustrates more detailed embodiments of the insulator layer 106 using FIG. 1A, it is to be appreciated that the more detailed embodiments may also be used with FIG. 1B. For example, the insulator layer 106 of FIG. 1B may comprise the first insulator layer 106f and the second insulator layer 106s in some embodiments.

Figure 3:
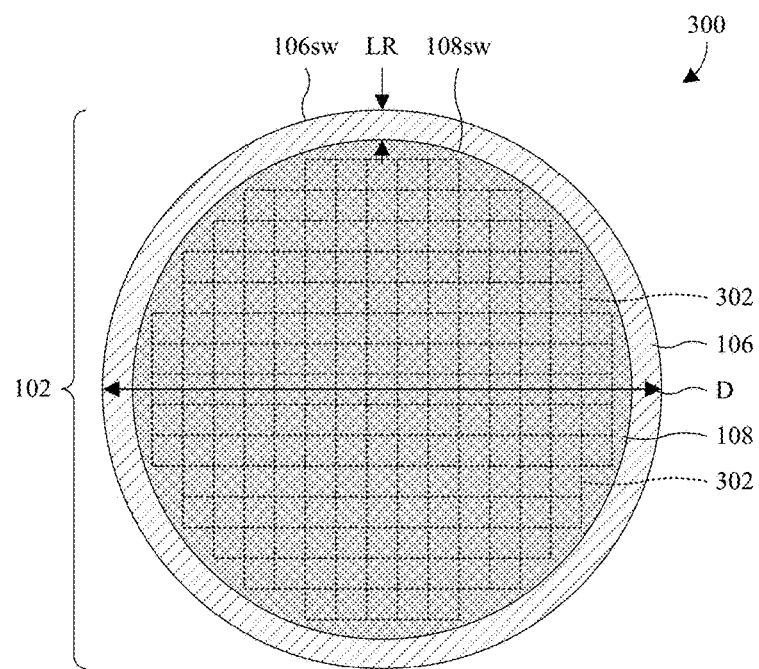
FIG. 3 illustrates a top view of some embodiments of the SOI substrate of FIG. 1A.

With reference to FIG. 3, a top view 300 of some embodiments of the SOI substrate 102 of FIG. 1A is provided. The SOI substrate 102 is circular and comprises a plurality of IC dies 302 arranged in a grid across the device layer 108. For ease of illustration, only some of the IC dies 302 are labeled 302. In some embodiments, a diameter D of the SOI substrate 102 is about 150, 200, 300, or 450 millimeters. In some embodiments, a sidewall 108sw of the device layer 108 is laterally recessed from a sidewall 106sw of the insulator layer 106 by a lateral recess amount LR. The lateral recess amount LR may, for example, be about 0.8-1.2 millimeters, about 0.8-1.0 millimeters, or about 1.0-1.2 millimeters.

Figure 4:
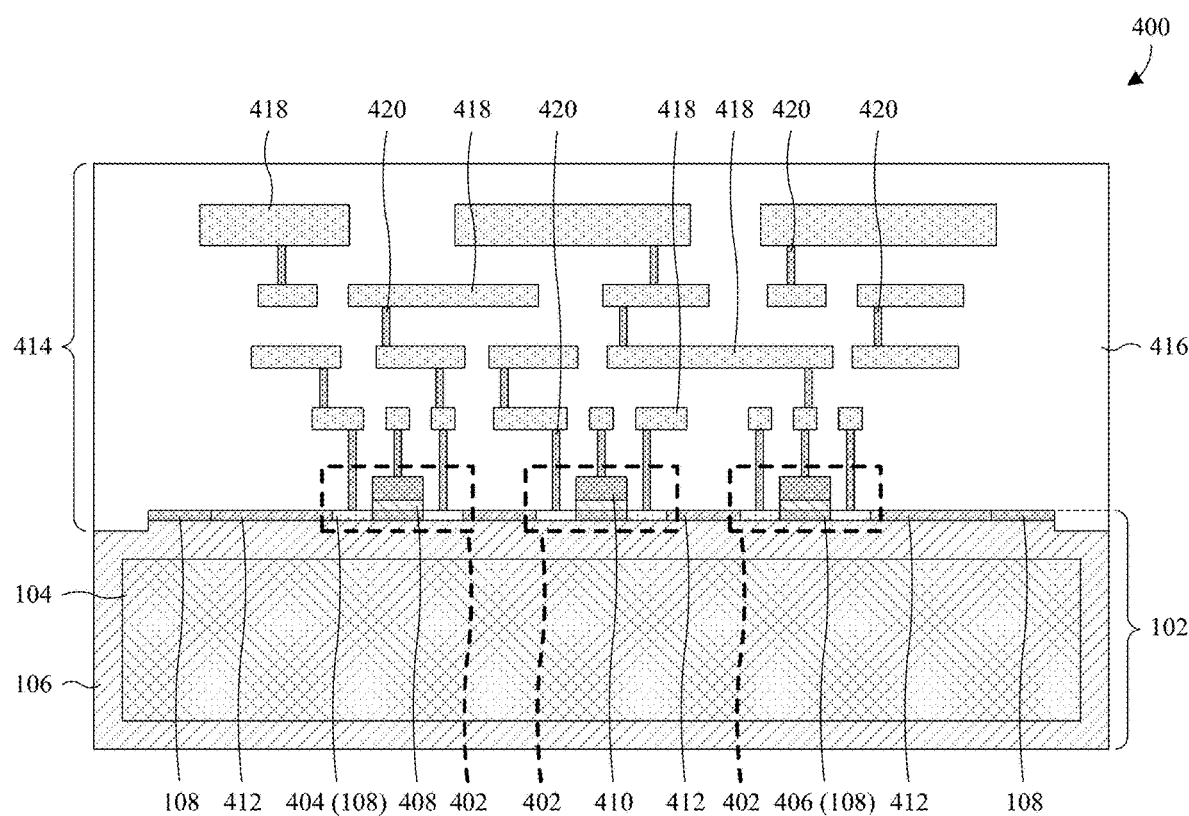
FIG. 4 illustrates a cross-sectional view of some embodiments of a semiconductor structure in which the SOI substrate of FIG. 1A finds application.

With reference to FIG. 4, a cross-sectional view 400 of some embodiments of a semiconductor structure in which the SOI substrate 102 of FIG. 1A finds application is provided. The semiconductor structure comprises a plurality of semiconductor devices 402 laterally spaced over the device layer 108. The semiconductor devices 402 may be, for example, MOSFETs, some other MOS devices, some other insulated-gate field-effect transistors (IGFETs), some other semiconductor devices, or any combination of the foregoing. Further, the semiconductor devices 402 may, for example, be fully-depleted or partially-depleted semiconductor devices.

In some embodiments, the semiconductor devices 402 comprise corresponding sources/drains 404, corresponding selectively-conductive channels 406, corresponding gate dielectric layers 408, and corresponding gate electrodes 410. For ease of illustration, only one of the sources/drains 404 is labeled 404, only one of the selectively-conductive channels 406 is labeled 406, only one of the gate dielectric layers 408 is labeled 408, and only one of the gate electrodes 410 is labeled 410. The sources/drains 404 and the selectively-conductive channels 406 are in and/or defined by the device layer 108. The sources/drains 404 are respectively at ends of the selectively-conductive channels 406, and each of the selectively-conductive channels 406 extends from one of the sources/drains 404 to another one of the sources/drains 404. The gate dielectric layers 408 respectively overlie the selectively-conductive channels 406, and the gate electrodes 410 respectively overlie the gate dielectric layers 408. The gate dielectric layers 408 may be or comprise, for example, silicon oxide and/or some other dielectric material, and/or the gate electrodes 410 may be or comprise, for example, doped polysilicon, metal, some other conductive material, or any combination of the foregoing.

In some embodiments, isolation structures 412 electrically separate the semiconductor devices 402. For ease of illustration, only some of the isolation structures 412 are labeled 412. The isolation structures 412 may, for example, be or comprise STI structures, deep trench isolation (DTI) structures, field oxide structures, or some other isolation structures.

A back-end-of-line (BEOL) interconnect structure 414 covers the SOI substrate 102 and the semiconductor devices 402. The BEOL interconnect structure 414 comprises an interconnect dielectric layer 416, a plurality of wires 418, and a plurality of vias 420. For ease of illustration, only some of the wires 418 are labeled 418, and only some of the vias 420 are labeled 420. The interconnect dielectric layer 416 may be or comprise, for example, borophosphosilicate glass (BPSG), phosphor-silicate glass (PSG), undoped silicon glass (USG), some other low κ dielectric, silicon oxide, some other dielectric, or any combination of the foregoing.

As used herein, a low κ dielectric may be or comprise, for example, a dielectric with a dielectric constant κ less than about 3.9, 3, 2, or 1.

The wires 418 and the vias 420 are alternatingly stacked in the interconnect dielectric layer 416 and define conductive paths extending to the semiconductor devices 402. The conductive paths may, for example, electrically couple the semiconductor devices 402 to other devices (e.g., other semiconductor devices), contact pads, or some other structures. The wires 418 and the vias 420 may be or comprise, for example, copper, aluminum copper, aluminum, tungsten, some other metal, or any combination of the foregoing. In some embodiments, topmost wires of the wires 418 are thicker than underlying wires of the wires 418.

While FIGS. 3 and 4 are described with regard to embodiments of the SOI substrate 102 in FIG. 1A, it is to be understood that embodiments of the SOI substrate 102 in FIG. 1B or FIG. 2 may alternatively be used in FIGS. 3 and 4. While FIG. 3 illustrates a specific number of IC dies 302 and a specific layout of IC dies 302, more or less IC dies 302 and/or other layouts of IC dies 302 is/are amenable in other embodiments. While FIG. 4 illustrates a specific layout of the BEOL interconnect structure 414, other layouts of the BEOL interconnect structure 414 are amenable in other embodiments. While FIG. 4 illustrates three semiconductor devices 402 and a specific layout for the semiconductor devices 402, more or less semiconductor devices and/or other layouts for the semiconductor devices 402 is/are amenable.

With reference to FIGS. 5-16, 17A, 17B, 18, 19A, 19B, and 20-22, a series of cross-sectional views 500-1600, 1700A, 1700B, 1800, 1900A, 1900B, and 2000-2200 of some embodiments of a method for forming and using an SOI substrate without implant radiation and/or plasma damage is provided. Note that FIGS. 17B and 19B illustrate enlarged cross-sectional views 1700B, 1900B within box BX respectively in FIGS. 17A and 19A. While the method is illustrated as forming embodiments of the SOI substrate 102 in FIGS. 1A and 2, the method may alternatively be employed to form embodiments of the SOI substrate 102 in FIG. 1B or in some other SOI substrate. Further, while FIGS. 5-16, 17A, 17B, 18, 19A, 19B, and 20-22 are described with reference to a method, it will be appreciated that the structures shown in FIGS. 5-16, 17A, 17B, 18, 19A, 19B, and 20-22 are not limited to the method and may stand alone.

Figure 5:
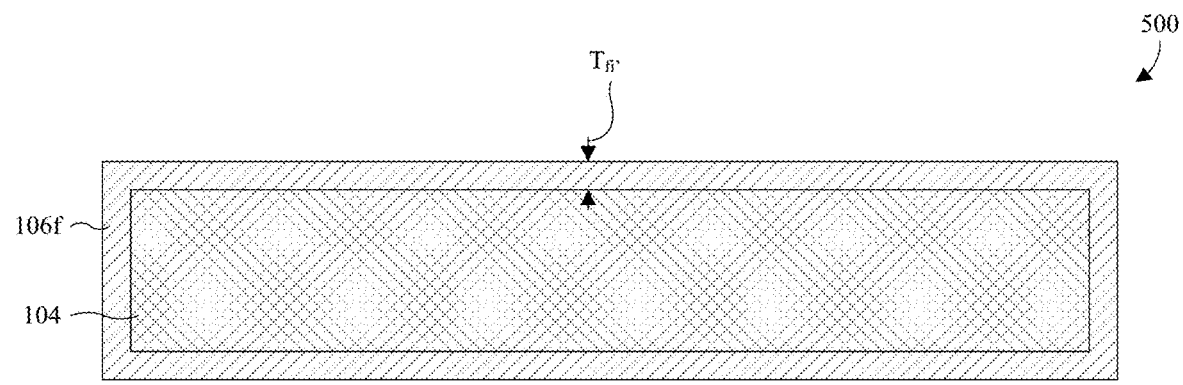
FIGS. 5-16, 17A, 17B, 18, 19A, 19B, and 20-22 illustrate a series of cross-sectional views of some embodiments of a method for forming and using an SOI substrate without implant radiation and/or plasma damage.

As illustrated by the cross-sectional view 500 of FIG. 5, a handle substrate 104 is provided. In some embodiments, the handle substrate 104 is or comprises monocrystalline silicon, some other silicon material, some other semiconductor material, or any combination of the foregoing. In some embodiments, the handle substrate 104 has a circular top layout and/or has a diameter of about 200, 300, or 450 millimeters. In other embodiments, the handle substrate 104 has some other shape and/or some other dimensions. Further, in some embodiments, the handle substrate 104 is a semiconductor wafer. In some embodiments, the handle substrate 104 has a high resistance and/or a low oxygen concentration. The high resistance and the low oxygen concentration individually reduce substrate and/or RF losses. The high resistance may, for example, be greater than about 1, 3, 4, or 9 kΩ/cm, and/or may, for example, be between about 1-4 kΩ/cm, about 4-9 kΩ/cm, or about 1-9 kΩ/cm. The low oxygen concentration may, for example, be less than about 1, 2, or 5 ppma, and/or may, for example, be between about 0.1-2.5 ppma, about 2.5-5.0 ppma, or about 0.1-5.0 ppma. In some embodiments, the handle substrate 104 has a low resistance to reduce substrate costs since a high resistance substrate may, for example, be costlier than a low resistance substrate. The low resistance may, for example, be less than about 8, 10, or 12 Ω/cm, and/or may, for example, be about 8-12 Ω/cm, about 8-10 Ω/cm, or about 10-12 Ω/cm. In some embodiments, the handle substrate 104 is doped with p-type or n-type dopants. The resistance of the handle substrate 104 may, for example, be controlled by a doping concentration of the handle substrate 104.

Also illustrated by the cross-sectional view 500 of FIG. 5, a first insulator layer 106f is formed on the handle substrate 104. In some embodiments, the first insulator layer 106f completely encloses the handle substrate 104. In other embodiments, the first insulator layer 106f is confined to a top surface of the handle substrate 104. In some embodiments, a thickness $T_{fi'}$ of the first insulator layer 106f is between about 100-150 angstroms, about 100-125 angstroms, or about 125-150 angstroms. The first insulator layer 106f may, for example, be or comprise silicon oxide, some other dielectric, or any combination of the foregoing. A process for forming the first insulator layer 106f may, for example, comprise depositing the first insulator layer 106f by thermal oxidation, chemical vapor deposition (CVD), physical vapor deposition (PVD), some other deposition process, or any combination of the foregoing.

In some alternative embodiments, a trap-rich layer (not shown) is formed on the handle substrate 104 before the forming of the first insulator layer 106f. In such embodiments, the first insulator layer 106f is formed on the trap-rich layer. Further, in some embodiments, the first insulator layer 106f is formed on sidewalls of the handle substrate 104, and/or is formed completely enclosing both the trap-rich layer and the handle substrate 104. An example of the trap-rich layer is shown by element 110 in FIG. 1B.

Figure 6:
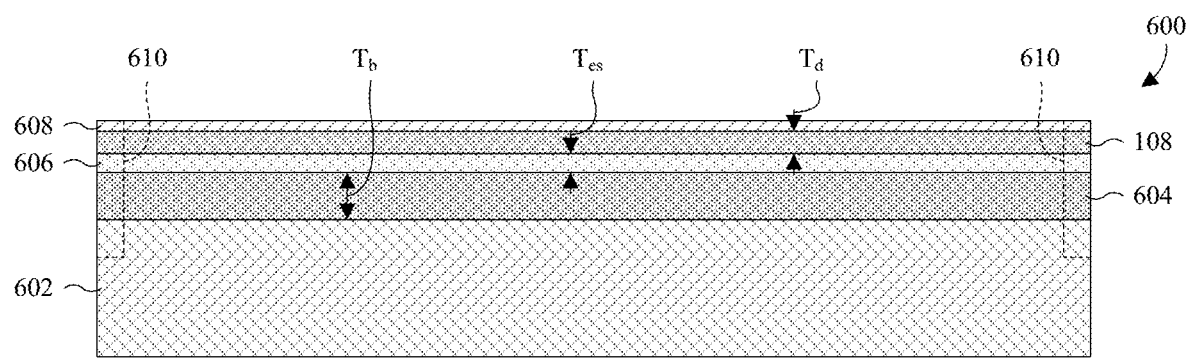

As illustrated by the cross-sectional view 600 of FIG. 6, a sacrificial substrate 602 is provided. In some embodiments, the sacrificial substrate 602 is or comprises monocrystalline silicon, some other silicon material, some other semiconductor material, or any combination of the foregoing. In some embodiments, the sacrificial substrate 602 is doped with p-type or n-type dopants. In some embodiments, the sacrificial substrate 602 has a circular top layout and/or has a diameter of about 200, 300, or 450 millimeters. In other embodiments, the sacrificial substrate 602 has some other shape and/or some other dimensions. In some embodiments, the sacrificial substrate 602 is a bulk semiconductor substrate and/or is a semiconductor wafer.

Also illustrated by the cross-sectional view 600 of FIG. 6, a buffer layer 604 is formed over the sacrificial substrate 602. In some embodiments, the buffer layer 604 is or comprises monocrystalline silicon, some other silicon material, some other semiconductor material, or any combination of the foregoing. In some embodiments, the buffer layer 604 is or comprises the same semiconductor material as the sacrificial substrate 602, has the same doping type as the sacrificial substrate 602, has a different doping concentration than the sacrificial substrate 602, or any combination of the foregoing. For example, the sacrificial substrate 602 may be or comprise P+ monocrystalline silicon, whereas the buffer layer 604 may be or comprise P– monocrystalline silicon. In some embodiments, the buffer layer 604 has the same doping type, the same doping concentration, the same resistivity, or any combination of the foregoing as the handle substrate 104 (see FIG. 5). In some embodiments, a thickness $T_b$ of the buffer layer 604 is between about 0.8-1.8 micrometers, about 0.8-1.3 micrometers, or about 1.3-1.8 micrometers.

In some embodiments, a process for forming the buffer layer 604 comprises growing the buffer layer 604 on the sacrificial substrate 602 by molecular beam epitaxy (MBE), vapor phase epitaxy (VPE), liquid phase epitaxy (LPE), some other epitaxial process, or any combination of the foregoing. In such embodiments, the sacrificial substrate 602 serves as a seed layer for the epitaxy. Alternatively, in some embodiments, the buffer layer 604 is formed by doping a top portion of the sacrificial substrate 602, such that the top portion defines the buffer layer 604. For example, supposing the sacrificial substrate 602 is or comprises P+ silicon, the top portion of the sacrificial substrate 602 may be counter doped with n-type dopants, such that the top portion, and hence the buffer layer 604, are or comprise P– silicon.

Also illustrated by the cross-sectional view 600 of FIG. 6, an etch stop layer 606 and a device layer 108 are formed stacked over the buffer layer 604, such that the device layer 108 overlies the etch stop layer 606. The etch stop layer 606 and the device layer 108 are crystalline materials with different crystalline lattices, such that etch stop layer 606 induces stress on the device layer 108. For example, the device layer 108 may be or comprise monocrystalline silicon, and the etch stop layer 606 may be or comprise germanium silicon germanium, whereby the etch stop layer 606 may induce tensile stress on the device layer 108.

In some embodiments, the etch stop layer 606 is or comprises silicon germanium, silicon carbide, silicon, some other crystalline material, or any combination of the foregoing, and/or is doped with boron, aluminum, some other p-type dopant, or any combination of the foregoing. For example, the etch stop layer 606 may be or comprise intrinsic (i.e., undoped) silicon germanium, boron-doped silicon germanium, or boron-doped elemental silicon. In some embodiments in which the etch stop layer 606 is or comprises silicon germanium, an atomic percent of germanium in the etch stop layer 606 is about 20-60%, about 20-40%, about 40-60%, or about 22-55%. For example, the etch stop layer 606 may be or comprise $Si_xGe_{1-x}$, where x is about 0.2-0.6, about 0.2-0.4, or about 0.4-0.6. In some embodiments in which the etch stop layer 606 is doped with boron, the doping concentration may be about $1\times10^{19}$ to about $5\times10^{21}$ atoms per cubic centimeter ($cm^3$), about $1\times10^{19}$ to about $5\times10^{20}$ atoms/$cm^3$, about $5\times10^{20}$ to about $5\times10^{21}$ atoms/$cm^3$, or about $5\times10^{19}$ to about $3\times10^{21}$ atoms/$cm^3$. In some embodiments, a thickness $T_{es}$ of the etch stop layer 606 is between about 15-40 nanometers, about 15-30 nanometers, or about 30-40 nanometers.

If the atomic percent of germanium in the etch stop layer 606 is too high (e.g., greater than about 50%, 60%, or some other suitable percent), or the boron doping concentration in the etch stop layer 606 is too high (e.g., greater than about $3\times10^{21}$ atoms/$cm^3$, about $5\times10^{20}$ atoms/$cm^3$, or some other suitable doping concentration), the device layer 108 may poorly form on the etch stop layer 606. For example, the crystalline lattice of the device layer 108 may form with a high concentration of crystalline defects, thereby leading to leakage current in devices subsequently formed on the device layer 108.

In some embodiments, the device layer 108 is or comprises monocrystalline silicon, some other semiconductor material, or any combination of the foregoing. In some embodiments, the device layer 108 is or comprises the same semiconductor material as the handle substrate 104 (see FIG. 5) and/or the sacrificial substrate 602. In some embodiments, the device layer 108 has a resistance less than about 8, 15, or 20 Ψ/cm and/or between about 8-20 Ω/cm, about 8-14 Ω/cm, or about 14-20 Ω/cm. In some embodiments, the resistance of the device layer 108 is the same or about the same as that of the handle substrate 104 (see FIG. 5). In other embodiments, the resistance of the device layer 108 is low (e.g., one, two, or more orders of magnitude less) compared to that of the handle substrate 104. In some embodiments, a thickness $T_d$ of the device layer 108 is less than about 20 or 40 nanometers, and/or is between about 20-40 nanometers or about 30-40 nanometers.

In some embodiments, the etch stop layer 606 and the device layer 108 are formed by epitaxy. For example, the etch stop layer 606 and the device layer 108 may each be formed by MBE, VPE, LPE, some other epitaxial process, or any combination of the foregoing. In some embodiments, the buffer layer 604 serves as a seed layer for the etch stop layer 606, and/or the etch stop layer 606 serves as a seed layer for the device layer 108. By forming the device layer 108 using the etch stop layer 606 as a seed layer, and by forming the etch stop layer 606 using the buffer layer 604 as a seed layer, crystalline quality of the etch stop layer 606 and the device layer 108 are high and crystalline defects are low. As a result, semiconductor devices formed on the device layer 108 have, among other things, high performance and low leakage current.

Also illustrated by the cross-sectional view 600 of FIG. 6, a cap dielectric layer 608 is formed on the device layer 108. In some embodiments, the cap dielectric layer 608 is or comprises silicon oxide, some other dielectric, or any combination of the foregoing. A process for forming the cap dielectric layer 608 may comprise, for example, depositing the cap dielectric layer 608 by thermal oxidation, PVD, CVD, some other deposition process, or any combination of the foregoing. In some embodiments, the cap dielectric layer 608 is localized to a top surface of the device layer 108. In some of such embodiments, the cap dielectric layer 608 is deposited by plasma-enhanced PVD to achieve such localization.

Figure 7:
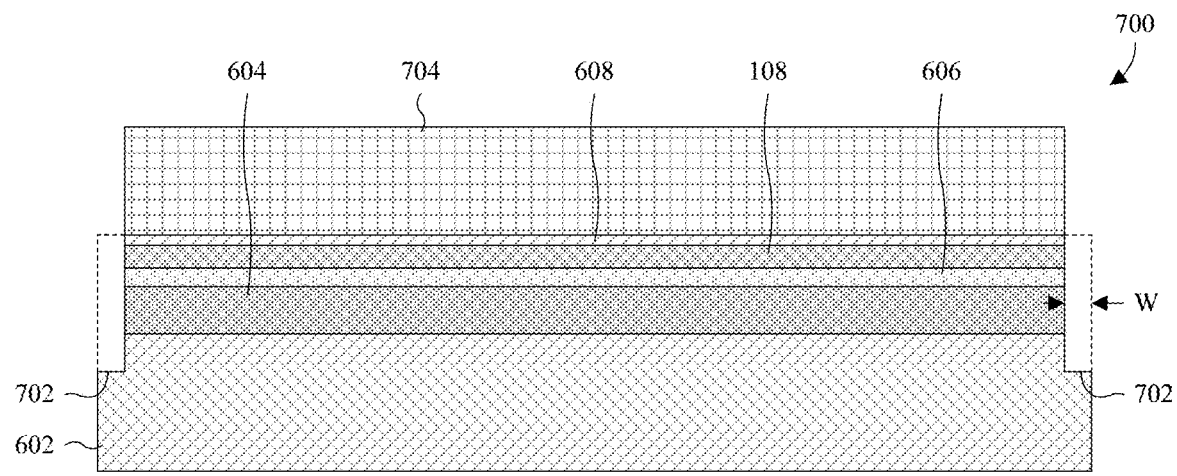

As illustrated by the cross-sectional view 700 of FIG. 7, the cap dielectric layer 608, the device layer 108, the etch stop layer 606, the buffer layer 604, and the sacrificial substrate 602 are patterned to remove edge portions 610 (see FIG. 6). By removing the edge portions 610, defects are prevented from forming at the edge portions 610 during subsequent grinding and/or wet etching. The edge defects have a propensity to concentrate at the edge portions 610 and negatively impact the quality of the device layer 108. Further, the patterning forms a ledge 702 at an edge of the sacrificial substrate 602. The ledge 702 is defined by the sacrificial substrate 602 and has a pair of ledge segments respectively on opposite sides of the sacrificial substrate 602. In some embodiments, the ledge 702 has a width W of about 0.8-1.2 millimeters, about 0.8-1.0 millimeters, or about 1.0-1.2 millimeters.

In some embodiments, the patterning is performed by a photolithography/etching process or some other patterning process. Further, in some embodiments, the patterning comprises: forming a mask 704 over the cap dielectric layer 608, performing an etch into the cap dielectric layer 608, the device layer 108, the etch stop layer 606, the buffer layer 604, and the sacrificial substrate 602 with the mask 704 in place; and removing the mask 704. In some embodiments, the mask 704 is or comprise silicon nitride, silicon oxide, some other hard mask material, photoresist, some other mask material, or any combination of the foregoing. In some embodiments, the mask 704 is formed using a wafer edge exposure (WEE) process tool. For example, a process for forming the mask 704 may comprise: depositing a photoresist layer on the cap dielectric layer 608; selectively exposing an edge portion of the photoresist layer to radiation using the WEE process tool; and developing the photoresist layer to form the mask 704.

Figure 8:
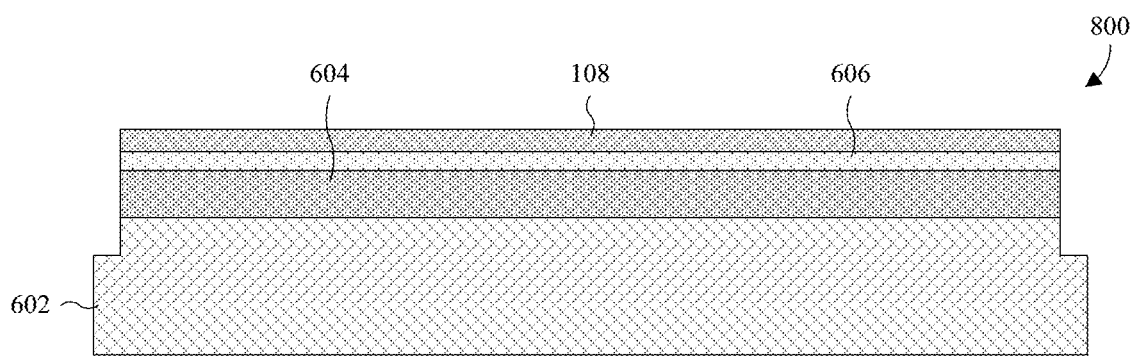

As illustrated by the cross-sectional view 800 of FIG. 8, the cap dielectric layer 608 (see FIG. 7) is removed. The removal may, for example, be performed by a CMP, an etching process, some other removal process, or any combination of the foregoing.

Figure 9:
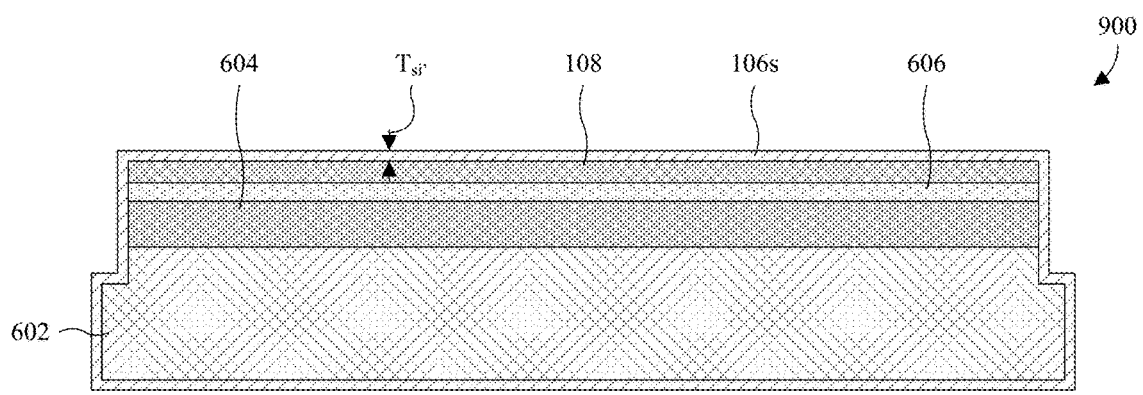

As illustrated by the cross-sectional view 900 of FIG. 9, a second insulator layer 106s is formed on the device layer 108. In some embodiments, the second insulator layer 106s completely encloses the device layer 108, the etch stop layer 606, the buffer layer 604, and the sacrificial substrate 602. In other embodiments, the second insulator layer 106s is confined to a top surface of the device layer 108. In some embodiments, the second insulator layer 106s has a net charge that is negative. By having a net charge that is negative, the second insulator layer 106s may electrostatically repel negative charge, thereby preventing or reducing leakage for semiconductor devices hereafter formed on the device layer 108. In other embodiments, the second insulator layer 106s has a net charge that is neutral (i.e., about zero). By having a net charge that is neutral, the second insulator layer 106s does not impact performance (e.g., ON resistance, threshold voltage, etc.) of semiconductor devices hereafter formed on the device layer 108. In some embodiments, a thickness $T_{si'}$ of the second insulator layer 106s is between about 20-50 angstroms, about 20-35 angstroms, or about 35-50 angstroms. Further, in some embodiments, the thickness $T_{si'}$ of the second insulator layer 106s is less than that of the first insulator layer 106f (see FIG. 5). A process for forming the second insulator layer 106s may comprise, for example, depositing the second insulator layer 106s by oxidation, CVD, PVD, some other deposition process, or any combination of the foregoing.

In some embodiments in which the second insulator layer 106s has a net charge that is neutral, the second insulator layer 106s is formed by a wet oxidation process. The wet oxidation process may, for example, comprise exposing the device layer 108 to water (i.e., $H_2O$) at elevated temperatures and elevated pressures. The elevated temperatures may, for example, be about 750-1150 degrees Celsius (° C.), about 750-950° C., or about 950-1150° C., and/or the elevated pressures may, for example, be about 700-820 torr, about 700-760 torr, about 760-820 torr, or about 760 torr. In some embodiments, the wet oxidation process further comprises flowing oxygen gas (e.g., $O_2$) and/or hydrogen gas (e.g., $H_2$) over the device layer 108 while the device layer 108 is being exposed to the water at the elevated temperatures and the elevated pressures. The flow rate for the oxygen gas may, for example, be about 0.1-30.0 standard litres per minute (SLM), about 0.10-15 SLM, or about 15-30 SLM, and/or the flow rate for the hydrogen gas may, for example, be about 0.05-10.00 SLM, about 0.05-5.00 SLM, or about 5-10 SLM. In some embodiments, the wet oxidation process forms the second insulator layer 106s by the following reaction: $Si+2H_2O \rightarrow SiO_2+2H_2$.

In some embodiments in which the second insulator layer 106s has a net charge that negative, the second insulator layer 106s is formed by a radical oxidation process. The radical oxidation process may, for example, comprise flowing oxygen gas (e.g., $O_2$) and hydrogen gas (e.g., $H_2$) over the device layer 108 while the oxygen and hydrogen gases are exposed to high power microwaves. The flow rate for oxygen gas may, for example, be about 0.1-30.0 SLM, about 0.10-15 SLM, or about 15-30 SLM, and/or the flow rate for the hydrogen gas may, for example, be about 0.05-10.00

SLM, about 0.05-5.00 SLM, or about 5-10 SLM. The high power microwaves generate oxygen radicals from the oxygen and hydrogen gases, and the oxygen radicals oxidize the device layer 108 to form the second insulator layer 106s with a net charge that is negative. A ratio of the oxygen gas to the hydrogen gas may, for example, be varied to control the magnitude of the net negative charge in the second insulator layer 106s. In some embodiments, the radical oxidation process is performed at temperatures between about 25-600° C., about 25-300° C., or about 300-600° C., and/or is performed at pressures between about 0.5-200.0 torr, about 0.5-100.0 torr, or about 100-200 torr.

Figure 10:
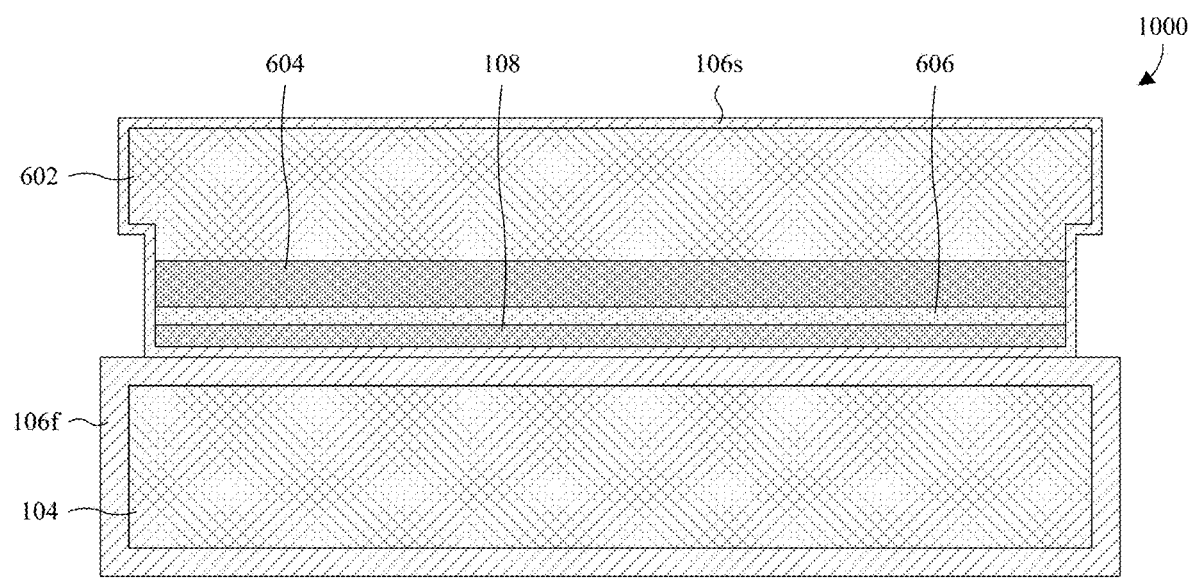

As illustrated by the cross-sectional view 1000 of FIG. 10, the structure of FIG. 9 is flipped vertically and bonded to the structure of FIG. 5, such that the buffer layer 604, the etch stop layer 606, the device layer 108, the first insulator layer 106f, and the second insulator layer 106s are between the handle substrate 104 and the sacrificial substrate 602. The bonding may, for example, be performed by fusion bonding, vacuum bonding, or some other bonding process. The fusion bonding may, for example, be performed with a pressure of about 1 standard atmosphere (atm), and/or the vacuum bonding may, for example, be performed at a pressure of about 0.1-30 millibars (mBar).

In some embodiments, a bond anneal is performed to strengthen the bond. In some embodiments, the bond anneal is performed at a temperature of about 300-400° C., about 300-350° C., about 350-400° C., or about 350° C. In some embodiments, the bond anneal is performed for about 1-3 hours, about 1-2 hours, about 2-3 hours, or about 2 hours.

Figure 11:
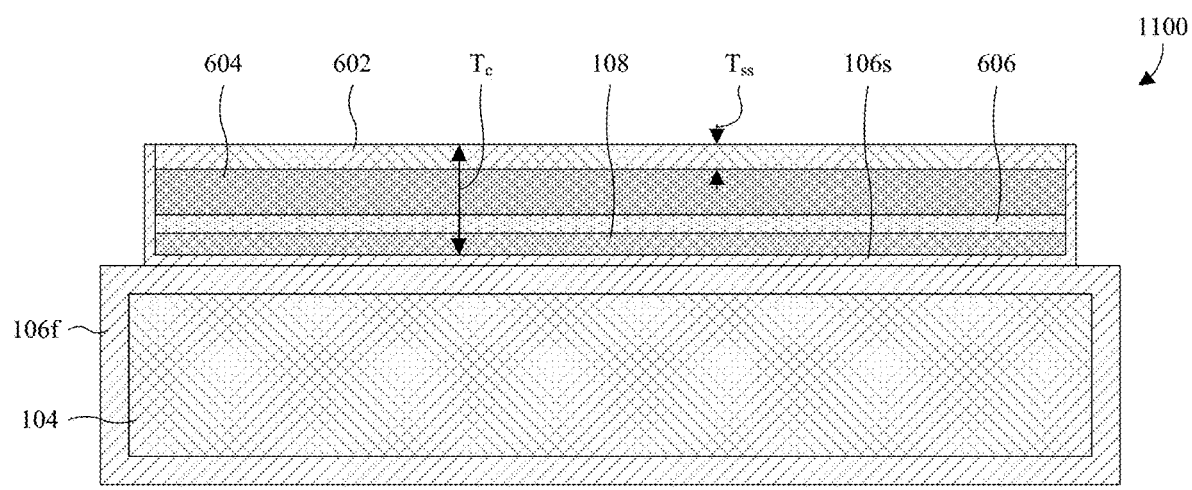

As illustrated by the cross-sectional view 1100 of FIG. 11, a first thinning process is performed on the sacrificial substrate 602 to remove an upper portion of the sacrificial substrate 602, thereby reducing a thickness $T_{ss}$ of the sacrificial substrate 602. Further, the first thinning process removes an upper portion of the second insulator layer 106s on the removed portion of the sacrificial substrate 602. In some embodiments, the first thinning process is performed until the sacrificial substrate 602, the buffer layer 604, the etch stop layer 606, and the device layer 108 have a combined thickness $T_c$ between about 17-25.5 micrometers, about 17-21 micrometers, or about 21-25.5 micrometers.

In some embodiments, the first thinning process is performed by a mechanical grinding process, a CMP, some other thinning process, or any combination of the foregoing. For example, the first thinning process may be performed wholly by a mechanical grinding process. As noted above, removal of the edge portions 610 of FIG. 6 prevents edge defects from forming at the edge portions 610 during the grinding. The edge defects have a propensity to form and concentrate at the edge portions 610 during the grinding.

Figure 12:
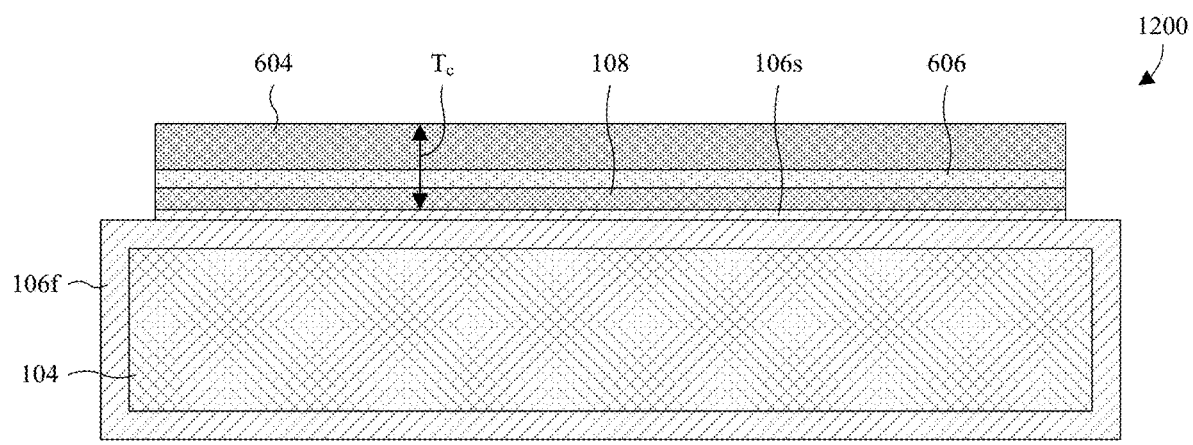

As illustrated by the cross-sectional view 1200 of FIG. 12, a first etch is performed into the sacrificial substrate 602 (see FIG. 11). The first etch stops on the device layer 108 and removes the sacrificial substrate 602. In some embodiments, the etch further removes a portion of the second insulator layer 106s on sidewalls of the sacrificial substrate 602, sidewalls of the buffer layer 604, sidewalls of the etch stop layer 606, sidewalls of the device layer 108, or any combination of the foregoing. In some embodiments, upon completion of the first etch, the buffer layer 604, the etch stop layer 606, and the device layer 108 have a combined thickness $T_c$ between about 0.7-1.5 micrometers, about 0.7-1.1 micrometers, or about 1.1-1.5 micrometers The first etch may, for example, be performed by a hydrofluoric/nitric/acetic (HNA) etchant, some other wet etchant, a dry etchant, or some other etchant. The HNA etchant may, for example, be or comprise a chemical solution comprising hydrofluoric acid, nitric acid, and acetic acid. The first etch has a first etch rate for material of the sacrificial substrate 602, and further has a second etch rate for material of the buffer layer 604 that is less than the first etch rate. In some embodiments, the first etch rate is about 90-100, 90-95, or 95-100 times greater than the second etch rate. These embodiments may, for example, arise when the first etch is performed by the HNA etchant, the sacrificial substrate 602 is or comprises P+ monocrystalline silicon, and the buffer layer 604 is or comprises P− monocrystalline silicon.

Figure 13:
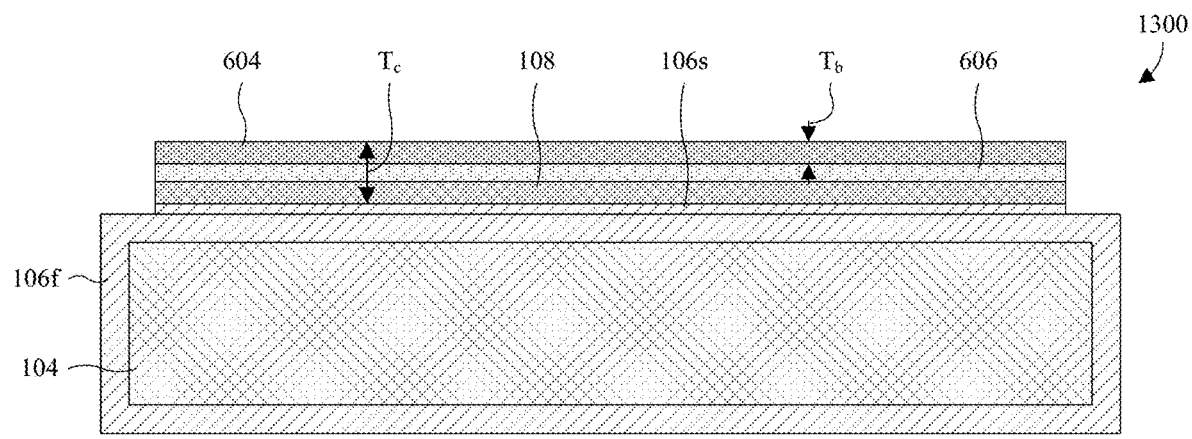

As illustrated by the cross-sectional view 1300 of FIG. 13, a second thinning process is performed on the buffer layer 604 to remove an upper portion of the buffer layer 604, thereby reducing a thickness $T_b$ of the buffer layer 604. In some embodiments, the second thinning process is performed until the buffer layer 604, the etch stop layer 606, and the device layer 108 have a combined thickness $T_c$ between about 0.4-1.0 micrometers, about 0.4-0.7 micrometers, or about 0.7-1.0 micrometers. The second thinning process may, for example, be performed by a CMP, some other suitable thinning process, or any combination of the foregoing.

Figure 14:
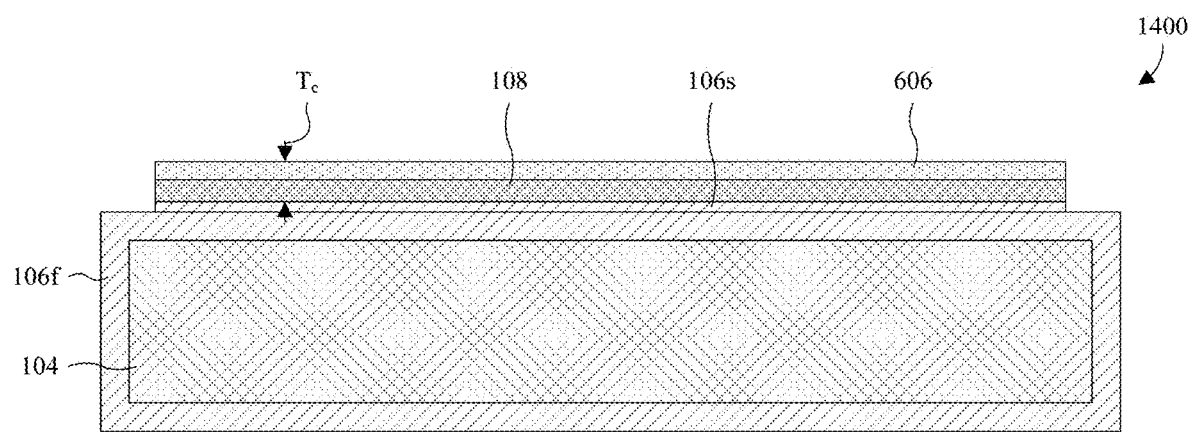

As illustrated by the cross-sectional view 1400 of FIG. 14, a second etch is performed into the buffer layer 604 (see FIG. 13). The second etch stops on the etch stop layer 606 and removes the buffer layer 604. In some embodiments, upon completion of the second etch, the etch stop layer 606 and the device layer 108 have a combined thickness $T_c$ between about 30-60 nanometers, about 20-45 nanometers, or about 45-60 nanometers.

The second etch may, for example, be performed by a TMAH etchant, some other suitable wet etchant, a dry etchant, or some other suitable etchant. The TMAH etchant may, for example, be or comprise a chemical or aqueous solution comprising tetramethylammonium hydroxide. The second etch has a first etch rate for material of the buffer layer 604, and further has a second etch rate for material of the etch stop layer 606 that is less than the first etch rate. In some embodiments, the ratio of the first etch rate to the second etch rate (i.e., selectivity) is high. For example, the ratio may be high in that the first etch rate is about 12, 30, or 50 times greater than the second etch rate and/or is about 12-100, 30-100, 30-50, or 50-100 times greater than the second etch rate.

The first etch rate may, for example, be about 12 or more times greater than the second etch rate in embodiments in which: the second etch is performed by the TMAH etchant; the buffer layer 604 is or comprises P− monocrystalline silicon; and the etch stop layer 606 is or comprises undoped silicon germanium with a germanium concentration between about 20-60 atomic percent or about 22-25 atomic percent. Further, the first etch rate may be about 30-100 times greater than the second etch rate in embodiments in which: the second etch is performed by the TMAH etchant; the buffer layer 604 is or comprises P− monocrystalline silicon; and the etch stop layer 606 is or comprises silicon germanium with a germanium concentration between about 20-60 atomic percent and a boron doping concentration of about $1\times10^{19}$ to $5\times10^{21}$ atoms/cm$^3$ or about $5\times10^{19}$ to about $3\times10^{21}$ atoms/cm$^3$. Further yet, the first etch rate may, for example, be about 30-100 times greater than the second etch rate in embodiments in which: the second etch is performed by the TMAH etchant; the buffer layer 604 is or comprises P− monocrystalline silicon; and the etch stop layer 606 is or comprises elemental silicon with a boron doping concentration of about $1\times10^{19}$ to $5\times10^{21}$ atoms/cm$^3$ or about $5\times10^{19}$ to about $3\times10^{21}$ atoms/cm$^3$.

Because the ratio of the first etch rate to the second etch rate is high, the buffer layer 604 may be removed with minimal damage to a top surface of the etch stop layer 606. As a result, the etch stop layer 606 has a small TTV and subsequent processing is highly uniform. For example, subsequent etching to remove the etch stop layer 606 may be highly uniform, leading to less damage (e.g., due to over etching) to a top surface of the device layer 108. The more uniform subsequent processing, the more uniform the final thickness of the device layer 108 and the higher the quality of the device layer 108.

If the germanium concentration in the etch stop layer 606 is too low (e.g., less than about 22%, 20%, or some other suitable percent), the ratio of the first etch rate to the second etch rate may be low, thereby subjecting the etch stop layer 606 to damage. Similarly, if the boron doping concentration in the etch stop layer 606 is too low (e.g., less than about $5\times10^{19}$ atoms/cm$^3$, about $1\times10^{19}$ atoms/cm$^3$, or some other suitable doping concentration), the ratio of the first etch rate to the second etch rate may be low, thereby subjecting the etch stop layer 606 to damage. The low ratio of the first etch rate to the second etch rate may, in turn, may lead to a high TTV and subsequent processing that is nonuniform.

Figure 15:
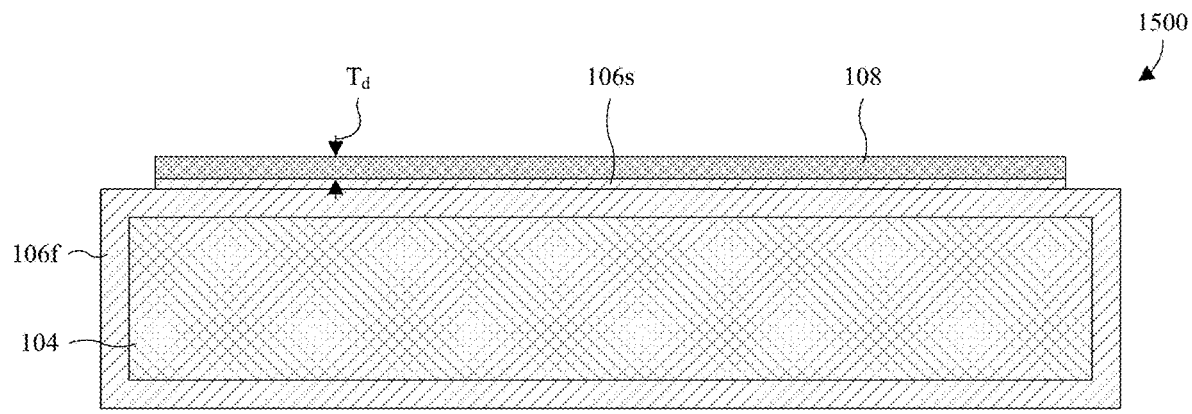

As illustrated by the cross-sectional view 1500 of FIG. 15, a third etch is performed into the etch stop layer 606 (see FIG. 14). The third etch stops on the device layer 108 and removes the etch stop layer 606. In some embodiments, upon completion of the third etch, a thickness $T_d$ of the device layer 108 is between about 20-35 nanometers, about 30-27 nanometers, or about 27-35 nanometers.

The third etch may, for example, be performed by a HCl etchant, some other suitable wet etchant, a dry etchant, or some other suitable etchant. The HCl etchant may, for example, be or comprise a chemical or aqueous solution comprising hydrochloric acid. The hydrochloric acid may, for example, make up 0.1-2.0 percent of the chemical or aqueous solution by weight or volume. The HCl etchant may, for example, be applied to the etch stop layer 606 at a temperature of about 600-900° C., about 600-750° C., or about 750-900° C., and/or at a pressure of about 5-760 torr, about 5-380 torr, or about 380-760 torr. Further, the HCl etchant may, for example, be applied to the etch stop layer 606 for about 20-1500 seconds about, 20-1200 seconds, or about 160-1500 seconds, and/or may, for example, be applied while hydrogen gas (e.g., H$_2$) flows over the etch stop layer 606. The flow rate for the hydrogen gas may, for example, be about 1-30 SLM, about 1-15 SLM, or about 15-30 SLM.

The third etch has a first etch rate for material of the etch stop layer 606, and further has a second etch rate for material of the device layer 108 that is less than the first etch rate. In some embodiments, the first etch rate is substantially more than the second etch rate, such that selectivity of the third etch for the etch stop layer 606, relative to the device layer 108, is high. For example, the first etch rate may be about 30-60, 30-45, 45-60, or 60-80 times greater than the second etch rate, and/or the first etch rate may be more than about 30, 45, 60, or 80 times greater than the second etch rate, such that the selectivity is high. Such embodiments may, for example, arise when the third etch is performed by the HCl etchant, the etch stop layer 606 is or comprises silicon germanium or boron-doped elemental silicon, and the device layer 108 is or comprises monocrystalline silicon. In embodiments in which the third etch has high selectivity for the etch stop layer 606 relative to device layer 108, damage to device layer (e.g., due to over etching) is minimal and the TTV of the device layer is small. This leads to low leakage and high power efficiency for semiconductor devices hereafter formed on the device layer 108. Further, uniformity between the semiconductor devices is high.

In some embodiments, an in-situ anneal is performed to smooth a top surface of the device layer 108. The in-situ anneal is "in-situ" in that the device layer 108 is not moved from the time the third etch is performed to the time the in-situ anneal is performed. By smoothing the top surface of the device layer 108, the TTV of the device layer 108 is low. This, in turn, promotes high uniformity between semiconductor devices on the device layer 108 and is increasingly important as semiconductor devices continue to shrink in size.

The in-situ anneal may, for example, be performed by flowing hydrogen gas (e.g., H$_2$) over the device layer 108 at elevated temperatures. The flow rate for the hydrogen gas may, for example, be about 10-30 SLM, about 10-20 SLM, or about 20-30 SLM, and/or the elevated temperatures may, for example, be about 750-1100° C., about 750-925° C., or about 925-1100° C. The in-situ anneal may, for example, persist for about 30-300 seconds, about 30-165 seconds, or about 165-300 seconds, and/or may, for example, be performed at a pressure of about 5-760 torr, about 5-380 torr, or about 380-760 torr.

Figure 16:
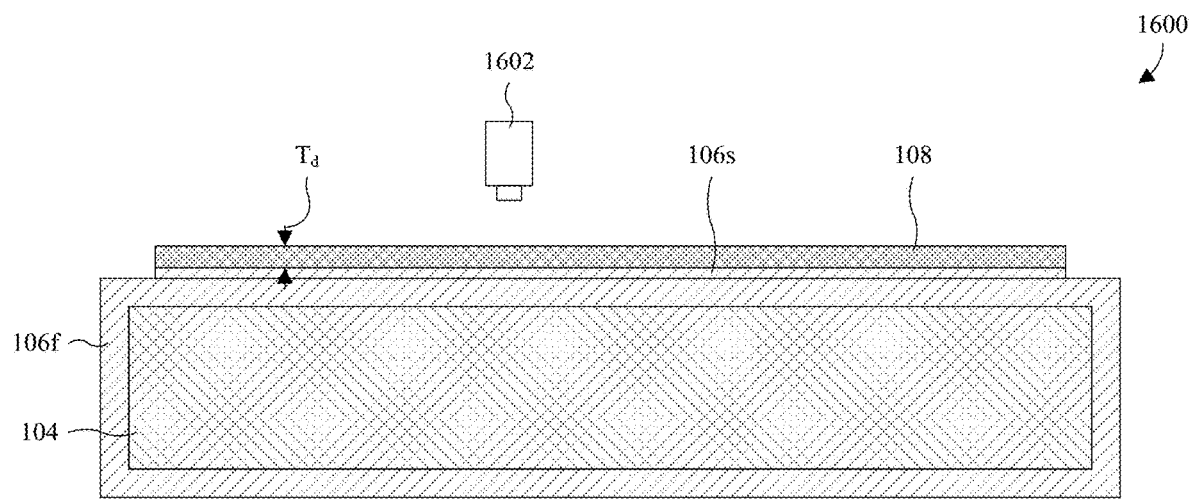

As illustrated by the cross-sectional view 1600 of FIG. 16, the thickness $T_d$ of the device layer 108 is measured. In some embodiments, the thickness $T_d$ of the device layer 108 is measured at a single location on the device layer 108. In other embodiments, the thickness $T_d$ of the device layer 108 is measured at multiple locations across the device layer 108. In some embodiments, the thickness $T_d$ of the device layer 108 is optically measured using an optical device 1602. For example, the optical device 1602 may be used to measure the thickness $T_d$ of the device layer 108 by spectral reflectance, ellipsometry, some other optical thickness measurement technique, or any combination of the foregoing.

After the measurement, the difference between the measured thickness of the device layer 108 and the desired final thickness of the device layer 108 is determined. In some embodiments in which the thickness $T_d$ of the device layer 108 is measured at multiple locations, the multiple measurements are combined into a single value that is used for determining the difference. The multiple measurements may, for example, be combined by an averaging function, a maximum function, a minimum function, a median function, or some other function. The difference between the measured thickness and the desired final thickness is then split amongst a plurality of removal cycles hereafter performed on the device layer 108 to achieve the desired final thickness, such that each of the removal cycles has a target removal amount. For example, supposing a difference between the measured thickness and the desired final thickness is 10 nanometers, the 10 nanometers may split amongst two removal cycles, such that a first removal cycle has a target removal amount of 5 nanometers and a second removal cycle has a target removal amount of 5 nanometers. As another example, supposing a difference between the measured thickness and the desired final thickness is 10 nanometers, the 10 nanometers may split amongst two removal cycles, such that a first removal cycle has a target removal amount of 7 nanometers and a second removal cycle has a target removal amount of 3 nanometers or vice versa. In some embodiments, the target removal amount for each removal cycle is the difference between the measured and desired final thicknesses divided by the total number of removal cycles. In other embodiments, the target removal amount for each removal cycle increases from the first removal cycle to the last removal cycle, such that the last removal cycle removes the least amount of the device layer 108 compared to the remaining removal cycles.

Figure 17A:
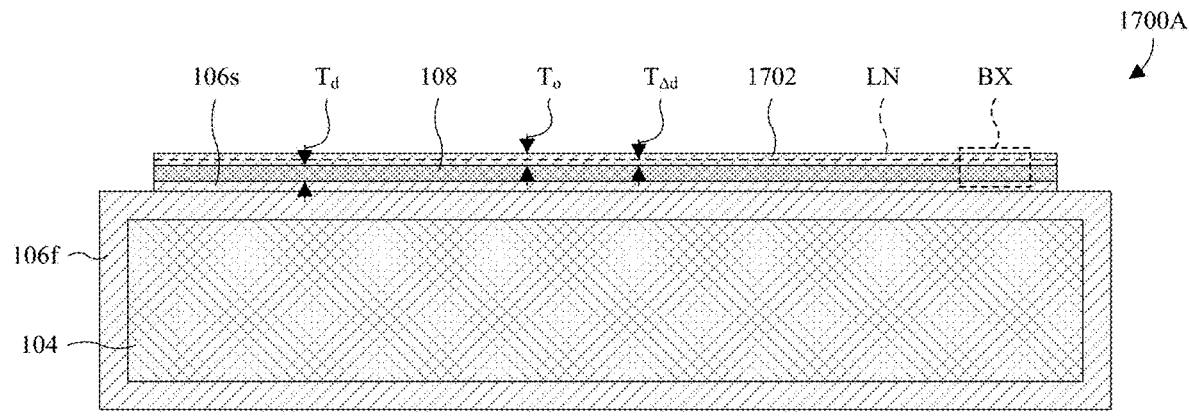
Figure 17B:
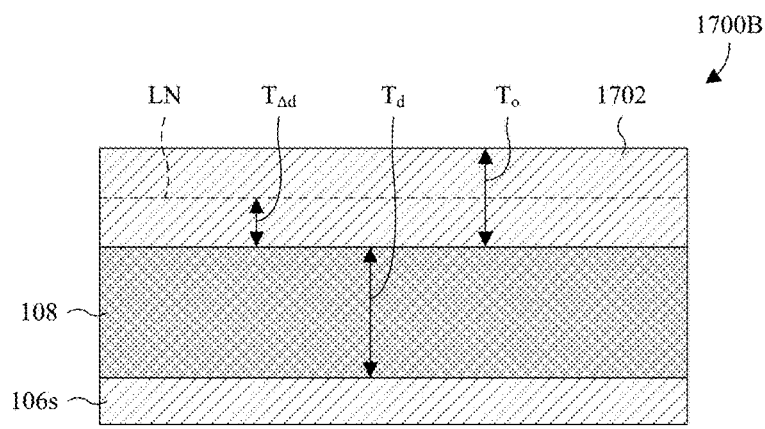
Figure 18:
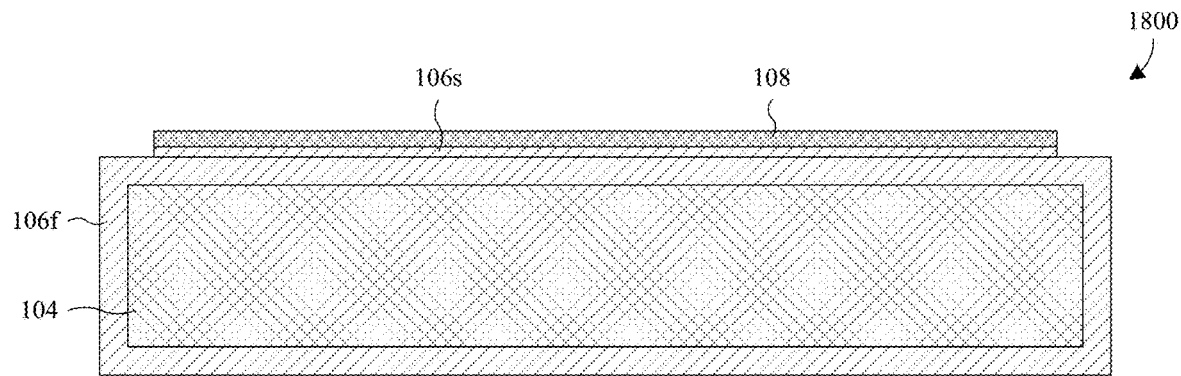

As illustrated by the cross-sectional views 1700A, 1700B, 1800 respectively of FIGS. 17A, 17B, and 18, a first removal cycle is performed to remove a corresponding target removal amount from the device layer 108. Note that FIG. 17B is an enlarged cross-sectional view 1700B that may, for example, be taken within box BX of FIG. 17A.

At FIGS. 17A and 17B, a top surface of the device layer 108 is oxidized. The oxidation partially consumes the device layer 108 to reduce the thickness $T_d$ of the device layer 108. Further, the oxidation forms an oxide layer 1702 on the device layer 108. The dashed line LN in the oxide layer 1702 may, for example, represent a top surface of the device layer 108 before the oxidation. In some embodiments, a thickness $T_o$ of the oxide layer 1702 is about twice the thickness reduction $T_{\Delta d}$ of the device layer 108.

The oxidation may, for example, be performed by exposing the device layer 108 to an aqueous solution. The exposure may, for example, persist for about 5-60 seconds, about 5-30 seconds, or about 30-60 seconds. The aqueous solution may, for example, comprise ozone (e.g., $O_3$) dissolved in the deionized water. One or more parameters of the oxidation may, for example, be varied to control the oxidation so the thickness reduction $T_{\Delta d}$ of the device layer 108 is equal to or about equal to the target removal amount. The parameter(s) may include, for example, the duration of the exposure, the amount of ozone in the chemical solution, some other parameter, or any combination of the foregoing. In some embodiments, the relationship between the parameter(s) and the thickness reduction $T_{\Delta d}$ is experimentally determined so the parameter(s) may be adjusted to achieve the target removal amount with a high degree of accuracy.

At FIG. 18, a fourth etch is performed into the oxide layer 1702 (see FIGS. 17A and 17B). The fourth etch stops on the device layer 108 and removes the oxide layer 1702. The fourth etch may, for example, be performed by a hydrofluoric acid (HF) etchant, some other suitable wet etchant, a dry etchant, or some other suitable etchant. The HF etchant may, for example, be or comprise a chemical or aqueous solution comprising hydrofluoric acid. The hydrofluoric acid may, for example, make up 0.1-1.0 percent of the chemical or aqueous solution by weight or volume. The HF etchant may, for example, be applied to the oxide layer 1702 for about 10-30 seconds, about 10-20 seconds, or about 20-30 seconds.

The fourth etch has a first etch rate for material of the oxide layer 1702, and further has a second etch rate for material of the device layer 108 that is less than the first etch rate. In some embodiments, the ratio of the first etch rate to the second etch rate (i.e., selectivity) is high. For example, the ratio may be high in that the first etch rate is about 12, 30, 50, or 100 times greater than the second etch rate. Embodiments in which the ratio of the first etch rate to the second etch rate is high may, for example, arise when the oxide layer 1702 is or comprises silicon oxide and the device layer 108 is or comprises monocrystalline silicon. Because the ratio of the first etch rate to the second etch rate is high, the oxide layer 1702 may be removed with minimal damage (e.g., over etching) to a top surface of the device layer 108. As a result, the device layer 108 has a small TTV and a high crystalline quality.

Figure 19A:
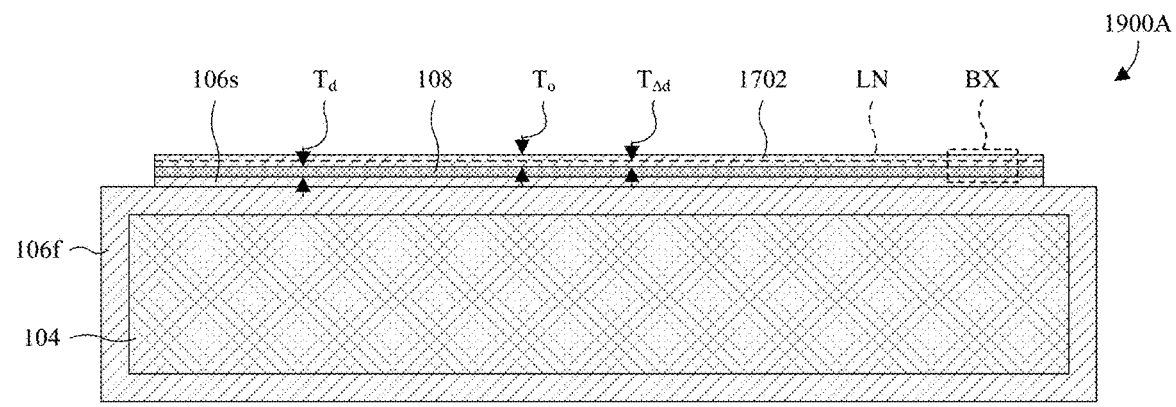
Figure 19B:
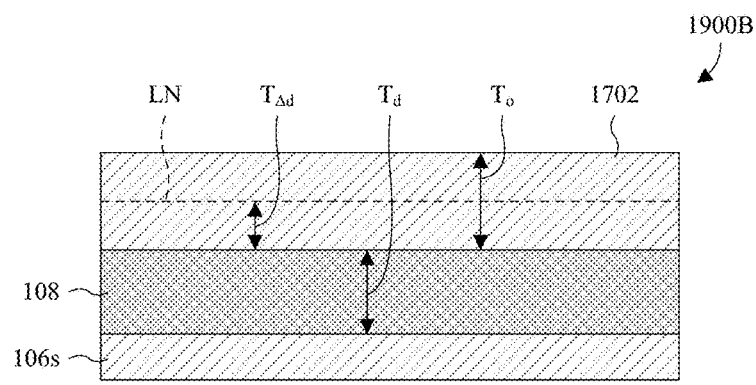
Figure 20:
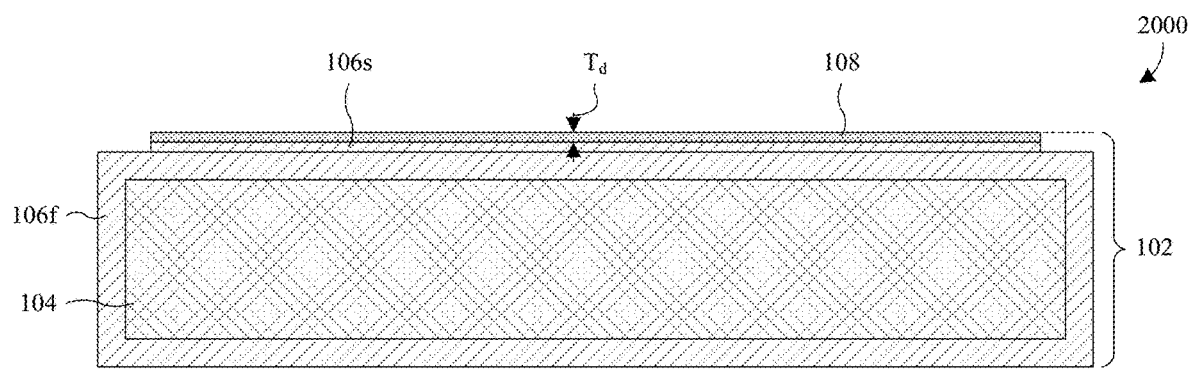

As illustrated by the cross-sectional views 1900A, 1900B, 2000 respectively of FIGS. 19A, 19B, and 20, the acts at FIGS. 17A, 17B, and 18 are repeated to perform a second removal cycle. The second removal cycle removes a corresponding target removal amount from the device layer 108, and further thins the device layer 108 to the desired final thickness. FIGS. 19A and 19B repeat the acts at FIGS. 17A and 17B, and FIG. 19B is an enlarged cross-sectional view 1900B that may, for example, be taken within box BX of FIG. 19A. FIG. 20 repeats the acts at FIG. 18. Collectively, the device layer 108, the first insulator layer 106f, the second insulator layer 106s, and the handle substrate 104 define an SOI substrate 102.

In some alternative embodiments, the acts at FIGS. 17A, 17B, and 18 are repeated multiple times to perform additional removal cycles that thin the device layer 108 to the desired final thickness. In some alternative embodiments, the measuring at FIG. 16 is performed with each removal cycle and the target removal amounts for remaining removal cycles are updated based upon the latest measurements of the device layer 108.

By cyclically thinning the device layer 108 to the desired final thickness (as illustrated by FIGS. 16, 17A, 17B, 18, 19A, 19B, and 20), multiple small removals may be performed instead of one large removal. This, in turn, allows greater control over the final thickness of the device layer 108. For example, the thickness $T_d$ of the device layer 108 may be accurately reduced to a final thickness less than about 20 or 10 nanometers and/or between about 7-20 nanometers, about 7-13 nanometers, or about 13-20 nanometers. Such a small thickness find application with fully-depleted MOS devices and other advanced MOS devices.

Figure 21:
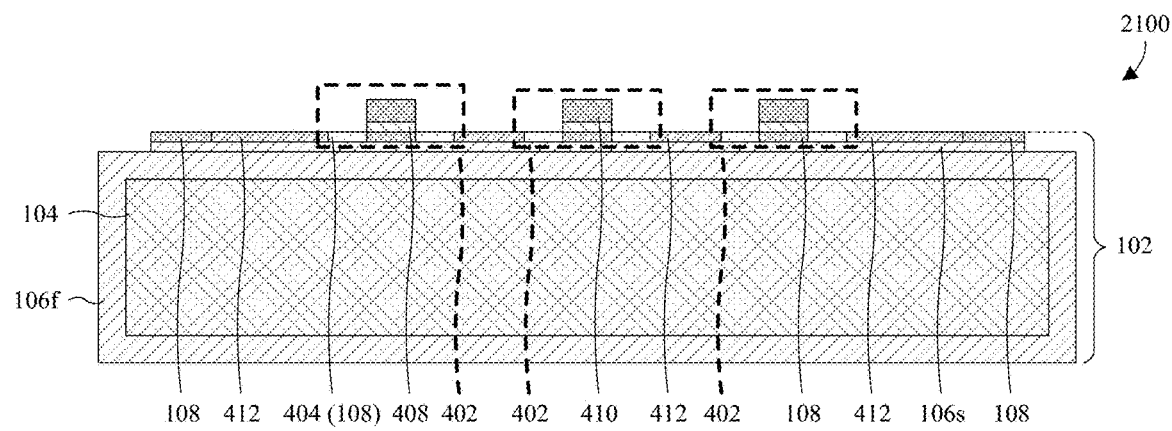

As illustrated by the cross-sectional view 2100 of FIG. 21, a plurality of semiconductor devices 402 are formed on the device layer 108. The semiconductor devices 402 may, for example, be as described with regard to FIG. 4 and/or may, for example, be MOSFETs, some other MOS devices, some other IGFETs, some other suitable semiconductor devices, or any combination of the foregoing. Further, the semiconductor devices 402 may, for example, be fully-depleted or partially-depleted semiconductor devices.

In some embodiments, a process for forming the semiconductor devices 402 comprises depositing a gate dielectric layer and a conductive layer over the device layer 108, and subsequently patterning (e.g., by photolithography) the dielectric layer and the conductive layer into gate electrodes 410 and gate dielectric layers 408. For ease of illustration, only one of the gate electrodes 410 is labeled 410, and only one of the gate dielectric layers 408 is labeled 408. The device layer 108 is doped (e.g., by ion implantation or some other doping process) to define sources/drains 404 bordering sidewalls of the gate electrodes 410. For ease of illustration, only one of the sources/drains 404 is labeled 404. In some embodiments, before forming the semiconductor devices 402, isolation structures 412 are formed extending through the device layer 108 to the second insulator layer 106s.

Figure 22:
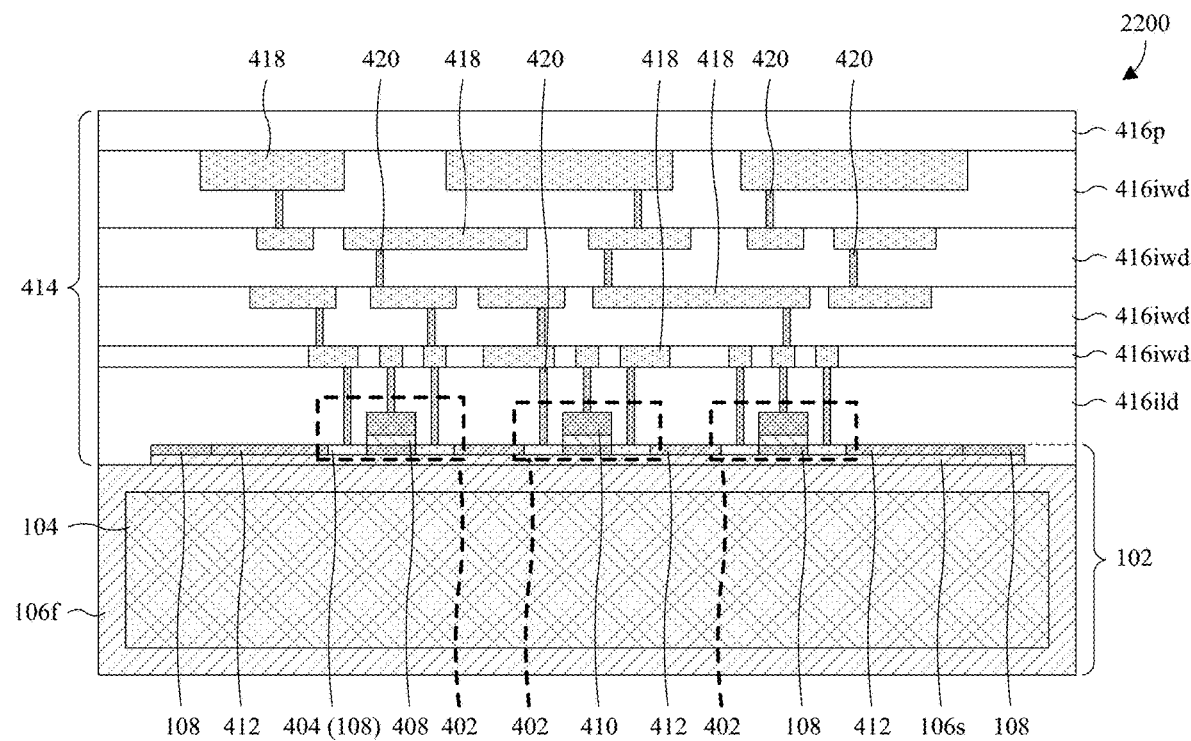

As illustrated by the cross-sectional view 2200 of FIG. 22, a BEOL interconnect structure 414 is formed over the device layer 108 and the semiconductor devices 402. The BEOL interconnect structure 414 comprises an interconnect dielectric layer, a plurality of wires 418, and a plurality of vias 420. For ease of illustration, only some of the wires 418 are labeled 418, and only some of the vias 420 are labeled 420. The interconnect dielectric layer comprises an interlayer dielectric (ILD) layer 416ild, a plurality of interwire dielectric (IWD) layers 416iwd, and a passivation layer 416p. The IWD layers 416iwd are stacked over the ILD layer 416ild, and the passivation layer 416p is over the IWD layers 416iwd. The ILD layer 416ild, the IWD layers 416iwd, and the passivation layer 416*p* may be or comprise, for example, BPSG, PSG, USG, some other low κ dielectric, silicon oxide, some other dielectric, or any combination of the foregoing. The wires 418 and the vias 420 are alternatingly stacked in the interconnect dielectric layer defined by the ILD layer 416*ild*, the IWD layers 416*iwd*, and the passivation layer 416*p*.

In some embodiments, a process for forming the BEOL interconnect structure 414 comprises forming a bottommost layer of the vias 420 by a single damascene process, and subsequently forming a bottommost layer of the wires 418 by the single damascene process. Further, in some embodiments, the process comprises forming remaining layers of the vias 420 and remaining layers of the wires 418 by repeatedly performing a dual damascene process. In some embodiments, the single damascene process comprises depositing a dielectric layer, patterning the dielectric layer with openings for a single layer of conductive features (e.g., a layer of vias or wires), and filling the openings with conductive material to form the single layer of conductive features. The dielectric layer may, for example, correspond to the ILD layer 416*ild* or a bottom IWD layer of the IWD layers 416*iwd*. In some embodiments, the dual damascene process comprises depositing a dielectric layer, patterning the dielectric layer with openings for two layers of conductive features (e.g., a layer of vias and a layer of wires), and filling the openings with conductive material to form the two layers of conductive features. The dielectric layer may, for example, correspond to one of the IWD layers 416*iwd* over the bottom IWD layer.

Figure 23:
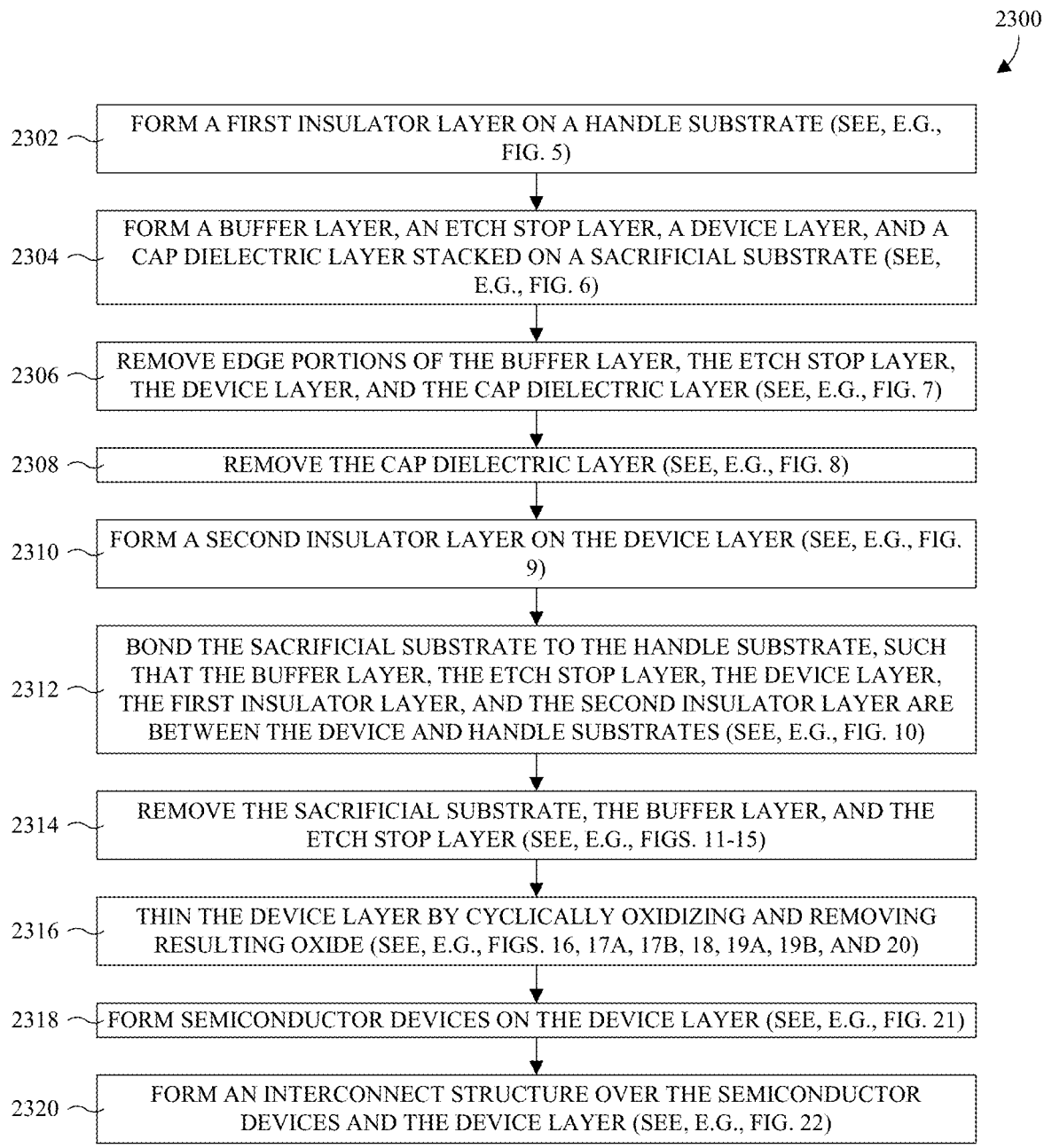
FIG. 23 illustrates a block diagram of some embodiments of the method of FIGS. 5-16, 17A, 17B, 18, 19A, 19B, and 20-22.

With reference to FIG. 23, a block diagram 2300 of some embodiments of the method of FIGS. 5-16, 17A, 17B, 18, 19A, 19B, and 20-22 is provided. The method may, for example, form a thin SOI substrate with thickness between about 7-20 nanometers.

At 2302, a first insulator layer is formed on a handle substrate. See, for example, FIG. 5.

At 2304, a buffer layer, an etch stop layer, a device layer, and a cap dielectric layer are formed stacked on a sacrificial substrate. See, for example, FIG. 6. In some embodiments, the buffer layer is or comprises P– monocrystalline silicon, the sacrificial substrate is or comprises P+ monocrystalline silicon, the device layer is or comprises monocrystalline silicon, the capacitor dielectric layer is or comprises oxide, or any combination of the foregoing. In some embodiments, the etch stop layer 606 is or comprises silicon germanium with a germanium concentration between about 20-60 atomic percent and a boron doping concentration of about $1 \times 10^{19}$ to $5 \times 10^{21}$ atoms/cm$^3$. In some embodiments, the etch stop layer 606 is or comprises undoped silicon germanium with a germanium concentration between about 20-60 atomic percent. In some embodiments, the etch stop layer 606 is or comprises elemental silicon with a boron doping concentration of about $1 \times 10^{19}$ to $5 \times 10^{21}$ atoms/cm$^3$.

At 2306, edge portions of the buffer layer, the etch stop layer, the device layer, and the cap dielectric layer are removed. See, for example, FIG. 7.

At 2308, the cap dielectric layer is removed. See, for example, FIG. 8.

At 2310, a second insulator layer is formed on the device layer. See, for example, FIG. 9. In some embodiments, the second insulator layer has a negative charge or a neutral charge. By having the neutral charge, the second insulator layer does not impact performance (e.g., ON resistance, threshold voltage, etc.) of semiconductor devices hereafter formed on the device layer. By having a negative charge, the second insulator layer electrostatically repels negative charge, thereby preventing or reducing leakage for the semiconductor devices.

At 2312, the sacrificial substrate is bonded to the handle substrate, such that the buffer layer, the etch stop layer, the device layer, the first insulator layer, and the second insulator layer are between the device and handle substrates. See, for example, FIG. 10.

At 2314, the sacrificial substrate, the buffer layer, and the etch stop layer are removed. See, for example, FIGS. 11-15. The removal of the sacrificial substrate may, for example, be performed by mechanical grinding, an HNA etch, some other removal process, or any combination of the foregoing. The removal of the buffer layer may, for example, be performed by a CMP, a TMAH etch, some other removal process, or any combination of the foregoing. The removal of the etch stop layer may, for example, be performed by an HCl etch, some other removal process, or any combination of the foregoing.

The TMAH etch may, for example, have high selectivity for the buffer layer, relative to the etch stop layer, in at least embodiments in which the buffer is or comprises monocrystalline silicon and the etch stop layer is or comprises undoped silicon germanium, boron doped silicon germanium, or boron doped elemental silicon. The high selectivity allows removal of the buffer layer with minimal damage to the etch stop layer, whereby the etch stop layer may have a small TTV and subsequent processing may be highly uniform. The HCl etch may, for example, have a high selectivity for the etch stop layer, relative to the device layer, in at least embodiments in which the device layer is or comprises monocrystalline silicon and the etch stop layer is or comprises undoped silicon germanium, boron doped silicon germanium, or boron doped elemental silicon. The high selectivity allows removal of the etch stop layer with minimal damage to the device layer, such that the device layer has a small TTV, low surface roughness, and a high crystalline quality. As a result, semiconductor devices formed on the device layer are more uniform and have better performance (e.g., less leakage, higher power efficiency, etc.).

In some embodiments, an annealing process is performed to smooth a top surface of the device layer after removing the etch stop layer. The annealing process is performed in situ, such that the device layer is not moved from the removal of the etch stop layer to the annealing process. By smoothing the top surface of the device layer, the TTV and the surface roughness of the device layer are further reduced, thereby further enhancing uniformity of semiconductor devices hereafter formed.

At 2316, the device layer is thinned by cyclically oxidizing and removing resulting oxide. See, for example, FIGS. 16, 17A, 17B, 18, 19A, 19B, and 20. By cyclically thinning the device layer, multiple small removals may be performed instead of one large removal. This, in turn, allows greater control over the final thickness of the device layer.

At 2318, semiconductor devices are formed on the device layer. See, for example, FIG. 21.

At 2320, an interconnect structure is formed over the semiconductor devices and the device layer. See, for example, FIG. 22.

As seen with regard to FIGS. 5-16, 17A, 17B, 18, 19A, 19B, and 20-22, and further with regard to FIG. 23, the SOI substrate may be formed without causing implant radiation and/or plasma damage to the second insulator layer and the device layer. Implantation is not performed through the second insulator layer and the device layer. Further, the second insulator layer and the device layer may not be directly exposed to plasma. Since the second insulator layer and the device layer are not subject to implant radiation and/or plasma damage, leakage and power consumption are low for semiconductor devices formed on the device layer.

Figure 24:
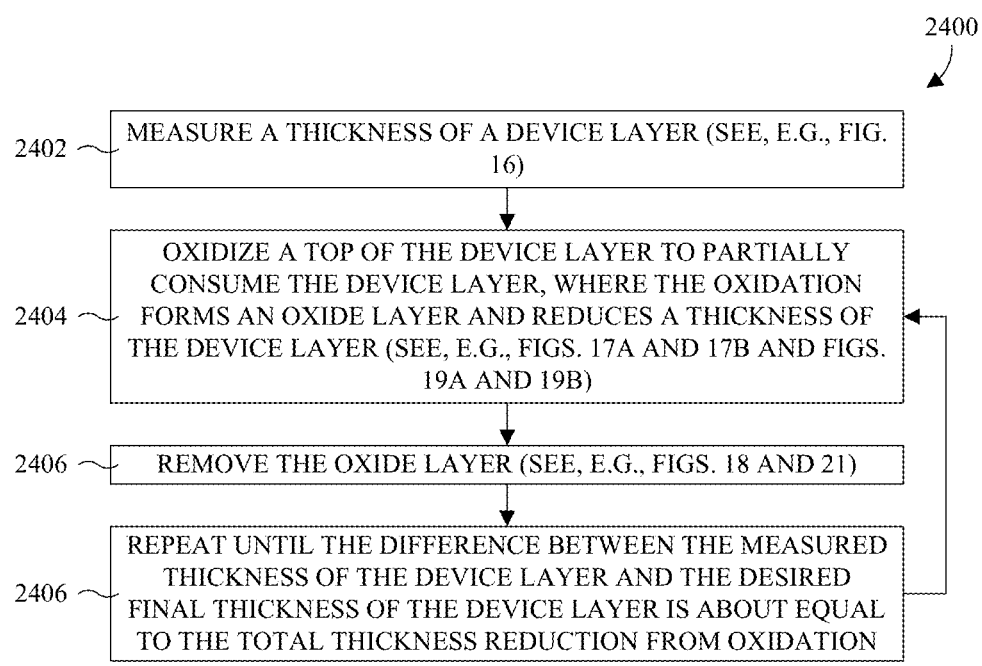
FIG. 24 illustrates a block diagram of some embodiments of a method for performing device layer thinning.

With reference to FIG. 24, a block diagram 2400 of some embodiments of a method for performing device layer thinning is provided. The method may, for example, be performed at 2316 of FIG. 23 to cyclically thin the device layer.

At 2402, a thickness of a device layer is measured. See, for example, FIG. 16. The thickness may, for example, be optically measured.

At 2404, a top of the device layer is oxidized to partially consume the device layer, where the oxidation forms an oxide layer and reduces a thickness of the device layer. See, for example, FIGS. 17A and 17B and FIGS. 19A and 19B. The thickness reduction may, for example, be less than the difference between the measured thickness of the device layer and the desired final thickness of the device layer. The oxidation may, for example, be performed by exposing the device layer to an aqueous solution in which ozone is dissolved.

At 2406, the oxide layer is removed. See, for example, FIGS. 18 and 21. The removal may, for example, be performed by an HF etch or some other etch.

At 2408, the acts at 2404 and 2406 are repeated one or more times until the difference between the measured thickness of the device layer and the desired final thickness of the device layer is about equal to the total thickness reduction of the device layer from oxidation at 2404. As noted above, by cyclically thinning the device layer to the desired final thickness, multiple small thinning processes may be performed instead of one large thinning process. This, in turn, allows greater control over the final thickness of the device layer.

While the block diagrams 2300, 2400 of FIGS. 23 and 24 are illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a method for forming a SOI substrate, the method including: epitaxially forming a device layer on a sacrificial substrate; bonding the sacrificial substrate to a handle substrate, such that the device layer is between the sacrificial and handle substrates; removing the sacrificial substrate; and cyclically thinning the device layer until the device layer has a target thickness, wherein each thinning cycle includes oxidizing a portion of the device layer and removing oxide resulting from the oxidizing. In some embodiments, the method further includes: measuring a thickness of the device layer; and determining a difference between the measured thickness and the target thickness, wherein the cyclical thinning has at least two thinning cycles, and wherein the at least two thinning cycles each partially reduces the difference. In some embodiments, the oxidizing includes exposing the device layer to a chemical solution in which ozone is dissolved in water, wherein the removing includes exposing the oxide to a chemical solution including hydrofluoric acid. In some embodiments, the method further includes: epitaxially forming an etch stop layer on the sacrificial substrate, wherein the etch stop layer includes undoped silicon germanium, boron doped silicon germanium, or boron doped elemental silicon, and wherein the device layer is formed on the etch stop layer; and removing the etch stop layer between the removing of the sacrificial substrate and the cyclical thinning. In some embodiments, the removing of the etch stop layer includes an HCl etch. In some embodiments, the method further includes forming an insulator layer on the device layer, wherein the insulator layer has a net charge that is neutral and is between the sacrificial and handle substrates during the bonding. In some embodiments, the method further includes forming an insulator layer on the device layer, wherein the insulator layer has a net charge that is negative and is between the sacrificial and handle substrates during the bonding. In some embodiments, the forming of the insulator layer includes oxidation by oxygen radicals.

In some embodiments, the present application provides another method for forming a SOI substrate, the method including: epitaxially forming a buffer layer over a sacrificial substrate; epitaxially forming an etch stop layer over the buffer layer; epitaxially forming a device layer over the etch stop layer; bonding the sacrificial substrate to a handle substrate, such that the buffer layer, the etch stop layer, and the device layer are between the sacrificial and handle substrates; removing the sacrificial substrate, the buffer layer, and the etch stop layer; and performing an anneal to smooth a top surface of the device layer after the removing of the etch stop layer. In some embodiments, the etch stop layer includes silicon germanium in which germanium has an atomic percent of about 20-60. In some embodiments, the etch stop layer is undoped. In some embodiments, the etch stop layer is doped with p-type dopants to a concentration of about $1 \times 10^{19}$-$5 \times 10^{21}$ atoms per cubic centimeter. In some embodiments, the etch stop layer includes elemental silicon doped with p-type dopants to a concentration of about $1 \times 10^{19}$-$5 \times 10^{21}$ atoms per cubic centimeter. In some embodiments, the removing of the buffer layer includes a TMAH etch. In some embodiments, the removing of the etch stop layer includes an HCl etch. In some embodiments, the anneal is performed in-situ without first moving the device layer from its position during the removing of the etch stop layer.

In some embodiments, the present application provides a SOI substrate including: a handle substrate; an insulator layer overlying the handle substrate; and a device layer overlying the insulator layer, wherein a portion of the insulator layer bordering the device layer has a net charge that is negative. In some embodiments, the insulator layer includes silicon oxide and the device layer includes monocrystalline silicon. In some embodiments, the device layer has a thickness of about 7-14 nanometers. In some embodiments, the device layer has a p doping type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor-on-insulator (SOI) substrate, the method comprising:
   epitaxially forming a device layer on a sacrificial substrate;
   bonding the sacrificial substrate to a handle substrate, such that the device layer is between the sacrificial and handle substrates;
   removing the sacrificial substrate; and
   cyclically thinning the device layer until the device layer has a target thickness using multiple thinning cycles, wherein each of the multiple thinning cycles comprises oxidizing a portion of the device layer and removing oxide resulting from the oxidizing, and wherein a first thinning cycle of the multiple thinning cycles removes a greater thickness of the device layer than a last thinning cycle of the multiple thinning cycles.

2. The method according to claim 1, further comprising:
   measuring a thickness of the device layer; and
   determining a difference between the measured thickness and the target thickness, wherein the cyclical thinning has at least two thinning cycles, and wherein the at least two thinning cycles each partially reduces the difference.

3. The method according to claim 1, wherein the oxidizing comprises exposing the device layer to a chemical solution in which ozone is dissolved in water, and wherein the removing comprises exposing the oxide to a chemical solution comprising hydrofluoric acid.

4. The method according to claim 1, further comprising:
   epitaxially forming an etch stop layer on the sacrificial substrate, wherein the etch stop layer comprises undoped silicon germanium, boron doped silicon germanium, or boron doped elemental silicon, and wherein the device layer is formed on the etch stop layer; and
   removing the etch stop layer between the removing of the sacrificial substrate and the cyclical thinning.

5. The method according to claim 4, wherein the removing of the etch stop layer comprises a hydrochloric gas (HCl) etch.

6. A method for forming a semiconductor-on-insulator (SOI) substrate, the method comprising:
   epitaxially forming a device layer on a sacrificial substrate;
   bonding the sacrificial substrate to a handle substrate, such that the device layer is between the sacrificial and handle substrates;
   removing the sacrificial substrate;
   cyclically thinning the device layer until the device layer has a target thickness using multiple thinning cycles, wherein each of the multiple thinning cycles comprises oxidizing a portion of the device layer and removing oxide resulting from the oxidizing, and wherein a first thinning cycle of the multiple thinning cycles removes a greater thickness of the device layer than a last thinning cycle of the multiple thinning cycles; and
   forming an insulator layer on the device layer, wherein the insulator layer has a net charge that is neutral and is between the sacrificial and handle substrates during the bonding.

7. The method according to claim 1, further comprising:
   forming an insulator layer on the device layer, wherein the insulator layer has a net charge that is negative and is between the sacrificial and handle substrates during the bonding.

8. The method according to claim 7, wherein the forming of the insulator layer comprises oxidation by oxygen radicals.

9. A method for forming a semiconductor-on-insulator (SOI) substrate, the method comprising:
   epitaxially forming a buffer layer over a sacrificial substrate;
   epitaxially forming an etch stop layer over the buffer layer;
   epitaxially forming a device layer over the etch stop layer, wherein the device layer and the etch stop layer are different semiconductor materials;
   bonding the sacrificial substrate to a handle substrate, such that the buffer layer, the etch stop layer, and the device layer are between the sacrificial and handle substrates;
   removing the sacrificial substrate, the buffer layer, and the etch stop layer, wherein the removing comprises performing an etch into the etch stop layer to remove the etch stop layer, wherein the etch stops on the device layer and comprises applying an etchant comprising hydrogen chloride to the etch stop layer, and wherein the etchant has an etch rate for the etch stop layer that is at least an order of magnitude greater than that for the device layer; and
   performing an anneal to smooth a top surface of the device layer after the removing of the etch stop layer.

10. The method according to claim 9, wherein the etch stop layer comprises silicon germanium in which germanium has an atomic percent of about 20-60.

11. The method according to claim 10, wherein the etch stop layer is undoped.

12. The method according to claim 10, wherein the etch stop layer is doped with p-type dopants to a concentration of about $1 \times 10^{19}$-$5 \times 10^{21}$ atoms per cubic centimeter.

13. The method according to claim 9, wherein the etch stop layer comprises elemental silicon doped with p-type dopants to a concentration of about $1 \times 10^{19}$-$5 \times 10^{21}$ atoms per cubic centimeter.

14. The method according to claim 9, wherein the removing of the buffer layer comprises a tetramethylammonium hydroxide (TMAH) etch.

15. The method according to claim 9, wherein the anneal is performed in-situ without first moving the device layer from its position during the removing of the etch stop layer.

16. The method according to claim 1, wherein the first thinning cycle removes 7 nanometers of thickness from the device layer, and wherein the last thinning cycle removes 3 nanometers of thickness from the device layer.

17. The method according to claim 9, wherein the etch is performed at a temperature less than about 900 degrees Celsius, and wherein the hydrogen chloride is about 0.1-2.0% of the etchant.

18. The method according to claim 6, further comprising:
   measuring a thickness of the device layer; and
   determining a difference between the measured thickness and the target thickness, wherein the cyclical thinning has at least two thinning cycles, and wherein the at least two thinning cycles each partially reduces the difference.

19. The method according to claim 6, wherein the oxidizing comprises exposing the device layer to a chemical solution in which ozone is dissolved in water, and wherein the removing comprises exposing the oxide to a chemical solution comprising hydrofluoric acid.

20. The method according to claim 6, further comprising:
epitaxially forming an etch stop layer on the sacrificial substrate, wherein the etch stop layer comprises undoped silicon germanium, boron doped silicon germanium, or boron doped elemental silicon, and wherein the device layer is formed on the etch stop layer; and
removing the etch stop layer between the removing of the sacrificial substrate and the cyclical thinning.

* * * * *